US012775758B2

(12) United States Patent
Yuksel et al.

(10) Patent No.: US 12,775,758 B2
(45) **Date of Patent: *Oct. 27, 2026**

(54) AUTONOMOUS SIMULATION AND SYNTHETIC RESPONSE SYSTEM FOR AGENTIC AI SYSTEMS

(71) Applicant: Aixplain, Inc., San Jose, CA (US)

(72) Inventors: Kamer Ali Yuksel, Munich (DE); Hassan Sawaf, San Jose, CA (US)

(73) Assignee: Aixplain, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 19/646,362

(22) Filed: Apr. 13, 2026

(65) Prior Publication Data

US 2026/0244833 A1 Aug. 20, 2026

Related U.S. Application Data

(63) Continuation of application No. 19/354,769, filed on Oct. 9, 2025, now Pat. No. 12,602,527.

(60) Provisional application No. 63/705,289, filed on Oct. 9, 2024.

(51) Int. Cl.

| | |
|---|---|
| ***G06F 7/48*** | (2006.01) |
| ***G06F 30/13*** | (2020.01) |
| ***G06F 30/27*** | (2020.01) |

(52) U.S. Cl.

CPC .............. *G06F 30/27* (2020.01); *G06F 30/13* (2020.01)

(58) Field of Classification Search

CPC ................................ G06F 30/27; G06F 30/13

See application file for complete search history.

(56) References Cited

U.S. PATENT DOCUMENTS

| | | | | |
|---|---|---|---|---|
| 12,277,409 B1 * | 4/2025 | Leeman-Munk | ... | G06F 11/3612 |
| 2025/0209017 A1 * | 6/2025 | Bhoja | ...................... | G06F 1/10 |

* cited by examiner

*Primary Examiner* — Nithya J. Moll

(74) *Attorney, Agent, or Firm* — FP; Sikander M. Khan

(57) ABSTRACT

A computer-implemented method, system, and non-transitory computer-readable medium for simulation-based testing and benchmarking of agentic artificial intelligence systems. A simulation agent is bound to at least one tool-access interface of an agentic AI system to replace at least one external tool. The simulation agent intercepts requests emitted at the tool-access interface, generates protocol-compliant responses using synthetic data and a simulated environment, and substitutes those responses for expected responses from the external tool, enabling task execution without invoking actual external tools. The agentic AI system executes one or more runs of a predefined task suite, including healthy and fault-injected runs, and actual agent outputs are evaluated against expected outputs to generate a performance vector. A simulation registry maintains metadata, schema definitions, and execution logs. The simulation agent selects among language model configurations based on reward scores and supports stealth observation mode to train surrogate tool models for closed-loop simulation.

20 Claims, 19 Drawing Sheets

System 200

```
batch_size = tf.shape(x)[0]
x = self.rescale(x)
patches = self.extract_patches(x)
x = self.patch_proj(patches)

class_emb = tf.broadcast_to(
    self.class_emb, [batch_size, 1, self.d_model]
)
x = tf.concat([class_emb, x], axis=1)
x = x + self.pos_emb

for layer in self.enc_layers:
    x = layer(x, training)

return  self.mlp_head(x[:, 0])
```

FIG. 15

AUTONOMOUS SIMULATION AND SYNTHETIC RESPONSE SYSTEM FOR AGENTIC AI SYSTEMS

The present patent application is a continuation of U.S. patent application Ser. No. 19/354,769, filed on Oct. 9, 2025, entitled "Autonomous simulated testing and benchmarking framework for agentic AI systems" which claims benefit to a U.S. Provisional utility patent application that is identified by a Ser. No 63/705,289 and that is titled "Simulated Testing and Benchmarking Environment for Agentic AI Systems", and that was filed with the U.S. Patent and Trademark Office (USPTO) on Oct. 9, 2024. The above-referenced document is herein incorporated by reference in its entirety.

STATEMENT REGARDING PRIOR DISCLOSURE BY THE INVENTORS

Aspects of this technology are described in an article Ahmet Gündüz, Yunsu Kim, Kamer Ali Yuksel, Mohamed Al-Badrashiny, Thiago Castro Ferreira, Hassan Sawaf, "AutoMode-ASR: Learning to Select ASR Systems for Better Quality and Cost", doi: doi.org/10.48550/arXiv.2409.1247, accepted for publication in SPECOM 2024 Conference, November 2024 and U.S. application Ser. No. 17/976,704, entitled "System and method for facilitating performing of tasks optimally using software applications", filed on Oct. 28, 2022, which is incorporated herein by reference in its entirety.

BACKGROUND

AI-driven automation has advanced toward increasingly complex architectures that employ multiple cooperating agents, commonly referred to as Agentic AI Systems. Such systems are capable of executing distributed workflows by delegating subtasks among specialized agents that access diverse computational tools and data repositories. Typical deployments involve agents invoking external utilities such as file-system search services, retrieval-augmented generation (RAG) connectors, database drivers, or web-based application programming interfaces (APIs) to acquire and process information in real time. Many of these workflows also incorporate human-in-the-loop interactions, where partial outputs are presented to human operators for review, approval, or correction before task completion.

While multi-agent orchestration has enabled significant efficiency gains across fields such as financial analytics, human-resources management, technical documentation, and healthcare decision support, the validation and benchmarking of such systems remain an unresolved challenge. Conventional testing infrastructures depend heavily on real data and operational toolchains. For instance, a language-analysis agent may require access to proprietary document repositories, or a research agent may rely on licensed web-scraping utilities. In environments that handle sensitive or classified data, such dependencies create compliance and confidentiality barriers. As a result, large portions of an Agentic AI workflow often cannot be executed in test mode without exposing protected information.

Existing test procedures typically employ simplified mockups or limited stubs that emulate only selected components of the production environment. These static substitutes lack realism in data diversity, temporal behavior, and fault manifestation. Consequently, they fail to expose subtle interaction faults, degraded recovery behaviors, or performance bottlenecks that emerge under real-world operating conditions. Moreover, current systems rarely support deliberate and controlled introduction of faults into agent communication channels, data sources, or simulated human inputs. Without such capability, it becomes difficult to quantify the resilience of agentic workflows under stress conditions.

In addition, testing infrastructures generally do not provide mechanisms to evaluate system performance quantitatively across repeated executions. Developers often rely on anecdotal or qualitative observations rather than measurable indicators such as completion rate, task accuracy, efficiency, and fault-recovery time. Absence of standardized benchmarking criteria impedes iterative improvement and comparison among different configurations or releases of an Agentic AI System.

Another limitation arises from the static nature of many test environments. Industry-specific conditions and data patterns evolve continuously through new publications, regulatory updates, or user-generated content. Without automated mechanisms to refresh test scenarios, evaluation environments quickly become obsolete, causing the system to be validated against outdated conditions.

Despite rapid progress in multi-agent AI technologies, existing testing and benchmarking infrastructures remain inadequate for evaluating agentic workflows that depend on heterogeneous tools, dynamic data sources, and human-in-the-loop participation. Present approaches do not allow autonomous operation of such systems without accessing real tools or confidential datasets, nor do they enable controlled fault-injection, repeatable benchmarking, or automatic scenario refresh. Accordingly, there exists a pressing technical need for a secure, flexible, and autonomous framework capable of realistically simulating data, environments, and human interactions for comprehensive testing and benchmarking of Agentic AI Systems under both normal and faulted operating conditions.

SUMMARY OF THE INVENTION

In one exemplary embodiment, a system for testing and benchmarking performance of an Agentic Artificial Intelligence (AI) System is described. The system comprises at least one processor and a memory storing computer-executable instructions which, when executed by the at least one processor, cause the system to bind a Simulation Agent to one or more tool-access interfaces of the Agentic AI System configured to invoke external tools, intercept a request emitted at the tool-access interfaces, generate a protocol-compliant response using synthetic data and a simulated environment, and substitute the protocol-compliant response for an expected response from the external tools, thereby enabling the Agentic AI System to execute tasks without invoking the external tools. The Simulation Agent is further configured to execute a healthy run and a fault-inserted run of a predefined task suite, and compute a performance vector comprising task-completion rate, accuracy, efficiency, resilience, and fault-recovery based on the healthy run and the fault-inserted run. The Simulation Agent constructs simulated repositories, virtual application programming interfaces (APIs), database instances, and file structures reflecting operational parameters of the external tools, and emulates complete toolchain behavior. The Simulation Agent injects one or more faults selected from file corruption, data truncation, record omission, network delay, protocol error, or erroneous human-input signaling according to a predefined fault schedule that specifies temporal offsets, repetition intervals, and severity levels, and validates fidelity between substituted responses and actual tool responses by computing a distributional similarity score between simulated and observed outputs captured during a live run and adjusting the synthetic data generation to minimize divergence between the simulated and observed outputs. The Simulation Agent autonomously harvests online resources comprising news articles, whitepapers, blogs, or industry reports, synthesizes industry-specific testing scenarios, and schedules periodic auto-refresh cycles to update the scenarios and regenerate synthetic data and simulated environments for newly identified topics.

In another exemplary embodiment, a computer-implemented method for testing and benchmarking the performance of an Agentic AI System is described. The method comprises binding a Simulation Agent to at least one tool-access interface of an Agentic AI System to replace external tools, intercepting, by the Simulation Agent, a request emitted at the tool-access interfaces, generating, by the Simulation Agent, a protocol-compliant response using synthetic data and a simulated environment, substituting, by the Simulation Agent, the protocol-compliant response for an expected response from the external tools, thereby enabling the Agentic AI System to execute tasks without invoking the external tools, executing, by the Agentic AI System, a healthy run and a fault-inserted run of a predefined task suite, and computing, by the Simulation Agent, a performance vector comprising task-completion rate, accuracy, efficiency, resilience, and fault-recovery based on the healthy run and the fault-inserted run. The method further comprises constructing simulated repositories, virtual APIs, database instances, and file structures reflecting operational parameters of the external tools, injecting one or more faults selected from file corruption, data truncation, record omission, network delay, protocol error, or erroneous human-input signaling according to a predefined fault schedule, validating fidelity between substituted responses and actual tool responses by computing a distributional similarity score, and autonomously harvesting online resources to synthesize industry-specific testing scenarios and schedule periodic auto-refresh cycles to maintain alignment with current industry conditions.

The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein:

FIG. 15 shows example software code that implements a Transformer block, in accordance with an embodiment of the present disclosure.

DETAILED DESCRIPTION

Figure 1A:
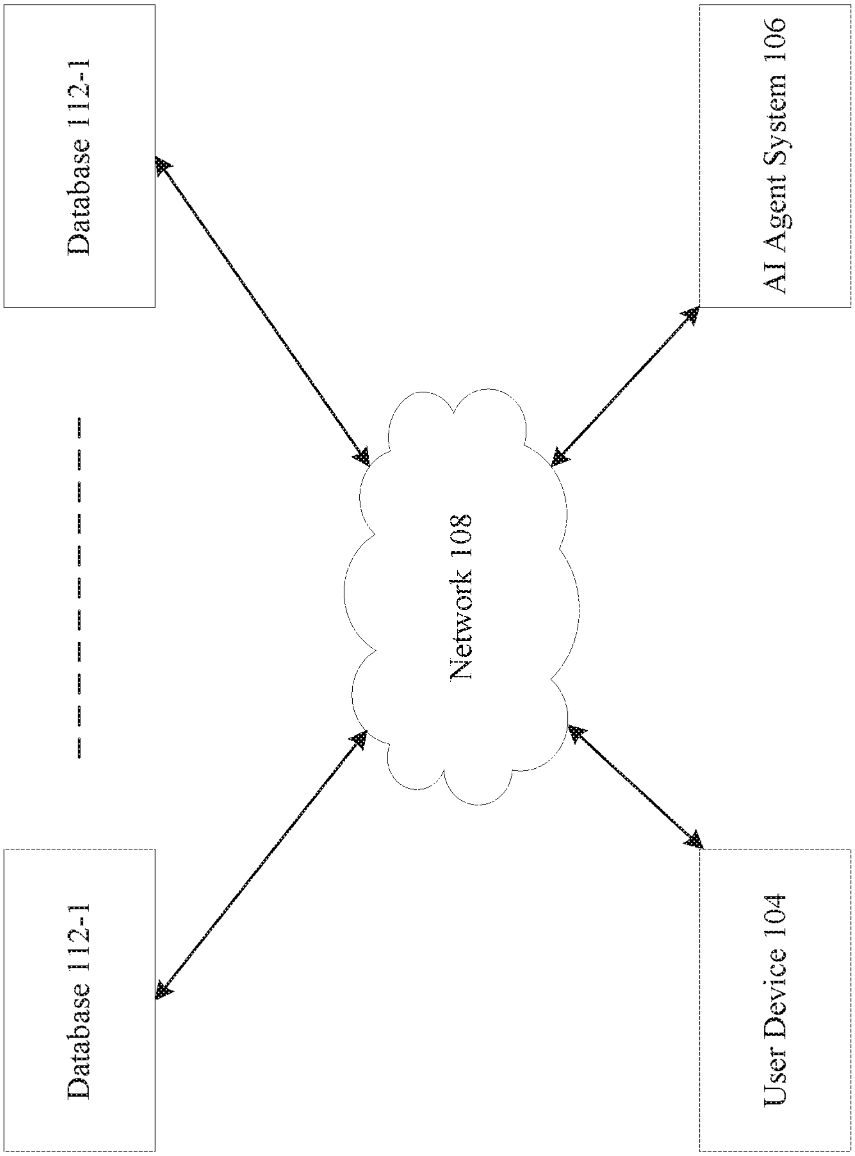
FIG. 1A is a diagram showing an exemplary network system, according to certain embodiments.

In the drawings, like reference numerals designate identical or corresponding parts throughout the several views. Further, as used herein, the words “a,” “an” and the like generally carry a meaning of “one or more,” unless stated otherwise.

Furthermore, the terms “approximately,” “approximate,” “about,” and similar terms generally refer to ranges that include the identified value within a margin of 20%, 10%, or preferably 5%, and any values therebetween.

FIG. 1A shows an example network diagram 100 utilized to describe the various disclosed embodiments. In the example network diagram 100, a user device 104, an AI agent system 106, and a plurality of databases 112-1 through 112-N, hereinafter referred to individually as a database 112 and collectively as databases 112, are communicatively connected via a network 108. The network 108 may include, but is not limited to, a wireless, cellular, or wired network, a local area network (LAN), a wide area network (WAN), a metro area network (MAN), the Internet, the worldwide web (WWW), similar networks, or any combination thereof.

The user device 104 may be, but is not limited to, a personal computer, a laptop, a tablet computer, a smartphone, a wearable computing device, or any other device capable of receiving and displaying notifications. The user device 104 interacts with the AI agent system 106 through the network 108 to send user queries and receive the generated outcomes.

Figure 2:
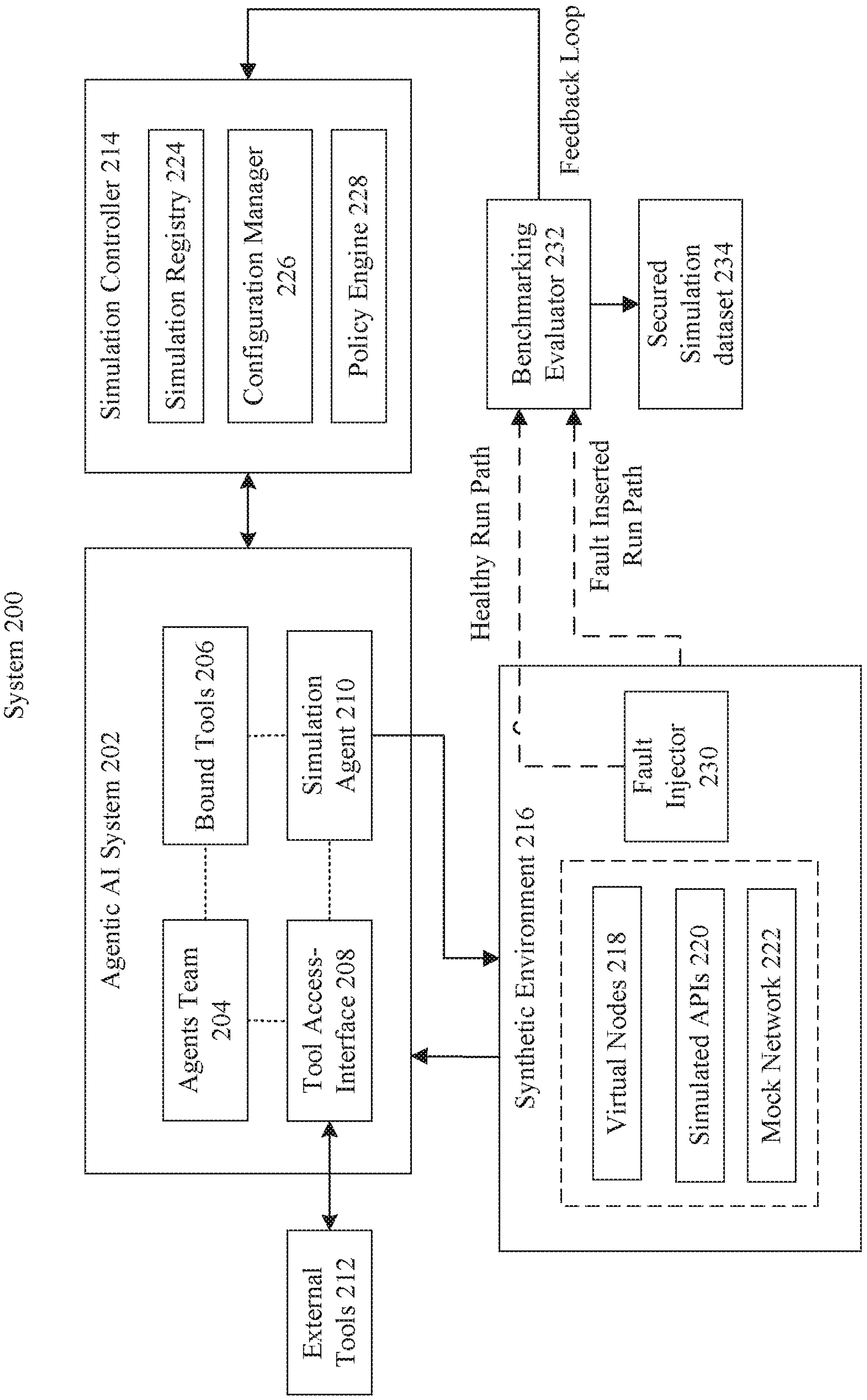
FIG. 2 illustrates an exemplary system for simulated testing and benchmarking of an agentic AI system, according to certain embodiments.

The AI agent system 106, is a representation of an agentic AI system as described in FIG. 2. The AI agent system is configured to receive and process user queries from the user device 104. Upon receiving a query, the AI agent system 106 analyzes the query, determines a sequence of tasks required to generate the desired outcome, and communicates with the appropriate databases 112-1 through 112-N to retrieve the necessary information. The AI agent system 106 may include various components such as processors, memory, and communication modules to execute these tasks and manage the interaction with the databases 112.

The databases 112-1 through 112-N store various types of data that the AI agent system 106 can access to perform the tasks necessary to respond to the user query. The databases 112 may contain text documents, images, videos, and other forms of data that are required for generating the outcome of the user query. The AI agent system 106 retrieves the data over the network 108 and processes the according to the determined sequence of tasks, generating the desired output which is then sent back to the user device 104.

Figure 1B:
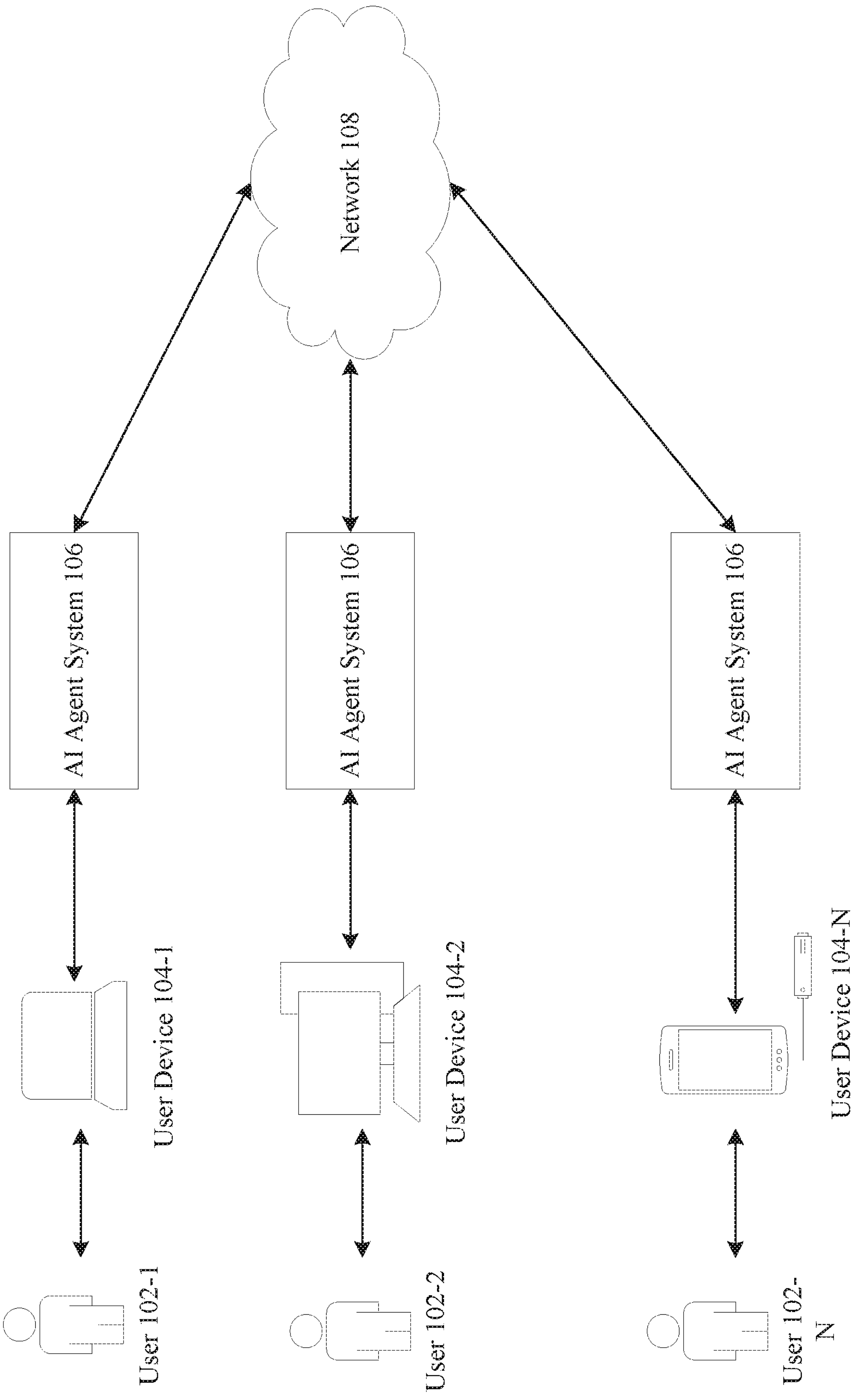
FIG. 1B shows an exemplary architecture of an AI agent system implemented in a network environment, according to certain embodiments.

FIG. 1B shows an exemplary architecture of the AI agent system 106 implementation in a network environment 110B. The network environment 100*b* includes users (102-1, 102-2, . . . , 102-N), enabled to operate one or more user devices (104-1, 104-2, . . . , 104-N) communicatively coupled to the AI agent system 106 through the network 108.

Users 102 represent individuals or entities that interact with the AI agent system 106 through the user devices 104. The users 102 may encompass a variety of roles within an organization or external parties that require access to, or interaction with, the AI agent system 106. Examples of the users 102 include employees within a company, customers seeking services or products, and partners or vendors involved in business operations.

In a corporate environment, employees, such as managers and data analysts, frequently interact with the AI agent system 106. Managers may query the AI agent system 106 to obtain business intelligence reports, track project statuses, or receive alerts related to key performance indicators (KPIs). For example, a marketing manager might request a summary of the latest sales trends, and the AI agent system 106 would retrieve and process relevant data from the databases 112 to generate the required report. Data analysts may utilize the AI agent system 106 to extract and analyze large datasets to identify patterns or generate predictive models. For example, a data analyst might access the system to gather customer behavior data and apply machine learning models to predict future purchasing trends. The users 102, thus, interact with the AI agent system 106 to get certain tasks performed.

The AI agent system 106 generally functions as an interface to all, or a subset of, enterprise data, information, and system functionality (e.g., via the network 108). The AI agent system 106 interacts with various components of the network 108 for accessing a variety of enterprise data and information as well as affecting change within the enterprise. The AI agent system 106 may use this enterprise data (and optionally externally available data) and information to generate a model or expand a pre-built model. The model may comprise a semantic model that ties various types of data to each other based on, for example, logic and rules, semantic relationships, and the like. The model may be monolithic or segmented/partitioned and may comprise language-specific/language-independent elements. The model may provide a description and/or map of pieces of information relevant to an enterprise and may be monolithic, or may be segmented, and may comprise language-specific and/or language-independent elements. The model may map generic or abstract concepts to real-world concepts, describe relationships within business concepts and systems, and provide an understanding of how words or terms, etc., are used, such as by a person, groups of persons, and the like. The understanding may further be classifiable to characteristics that identify a person or groups of persons and the like, such as a person's native language, a person's education, a person's current role in an enterprise, demographics of the person, and the like. In this way, understanding of how words or terms are used may be enriched even with restricted access to knowledge of a person, such as might occur when protecting personally identifying information of a person, and the like. The model may incorporate how a business or company uses terms/words and in what contexts the terms/words may be used. The model may comprise a business- and application-specific knowledge graph that the AI agent system 106 can use for general knowledge query, customer-specific master data/facts, identification/contextualization of mapped external data sources for access, as well as elements to support reasoning, disambiguation, etc.

The AI agent system 106 may generally function as an omni-channel, intelligent, proactive virtual agent with respect to the user devices 104-1 through 104-N. The AI agent system 106 may receive queries, commands, or other requests from the user devices 104-1 through 104-N via a variety of communication channels. The AI agent system 106 may use the model to respond to the queries, commands, or other requests from the user devices 104-1 through 104-N. For example, with queries, the AI agent system 106 can refer to or look to the model to obtain answers to the queries. The AI agent system 106 can also initiate communication to the user devices 104-1 through 104-N regarding workflow (e.g., initiate meeting reminders or contact user devices 104-1 through 104-N regarding the status of a project) via a variety of communication channels.

The AI agent system 106 may be used with enterprise systems of a variety of industries, e.g., aerospace, manufacturing, agriculture, shipping, oil and gas, mining, construction, etc. Embodiments of the model, such as a semantic model embodiment, may reflect the unique terminology used in a particular industry, within a particular enterprise in the industry, within a particular enterprise independent of its industry, and the like. In embodiments, the model may reflect how terms relate to each other in a hierarchy or other semantic organization, such as represented by a graph. As appreciated by one of ordinary skill in the art, the AI agent system 106 may be used with other industries, independent of use in the other industries.

The AI agent system 106 may, without limitation, provide the following functionalities: obtain answers to questions from the user devices 104-1 through 104-N about a business, such as metrics about the business, knowledge of how and where the business conducts business, information about products and services of a business, information about the market or industry of the business, information about how a business is organized, and the like, engage in conversation with users via the user devices 104-1 through 104-N, provide assistance with workflows, listen to requests from the user devices 104-1 through 104-N, take actions based on requests, initiate communication with employees of an enterprise, with customers of the enterprise (including to implement complex speech dialogs) and with others that have some relationship to the enterprise (such as contractors, prospective customers, partners, investors, board members, managers, vendors, suppliers, service providers, and many others), and the like. References to "users" of the AI agent system should be understood to encompass these and other types of users. The AI agent system 106 may initiate suggested actions to the user devices 104-1 through 104-N (e.g., the AI agent system can send a hint of suggested actions to the user devices 104-1 through 104-N).

The AI agent system 106 may be optimized over time as new amounts of data are incorporated into the model. In embodiments, the system may evolve and become smarter in terms of industry and customer knowledge, user behaviors, preferences, use of words and terms, and additional languages. This may, for example, result in faster response times, greater relevance of responses, fewer exchanges to satisfy an inquiry, and the like.

FIG. 1B, thus, shows a single network 108 between the user devices 104-1 through 104-N and the AI agent system 106, the user devices 104-1 through 104-N and the AI agent system 106 may be on the same network 108. In some embodiments, there may be multiple networks 108 between the user devices 104-1 through 104-N and the AI agent system 106 that are interconnected. The network 108 may be a private network, a public network, or a hybrid network. The network 108 may be a local area network or wide area network.

The network 108 may be connected via wired or wireless links. Wired links may include Digital Subscriber Line (DSL), coaxial cable lines, Ethernet, fiber-optic, or other links used for network infrastructure as would be understood by one of ordinary skill in the art. The wireless links may include cellular, BLUETOOTH, Wi-Fi, Worldwide Interoperability for Microwave Access (WiMAX), an infrared channel, satellite bands, or other wireless networking technologies as would be understood by one of ordinary skill in the art. The wireless links may also include any cellular network standards used to communicate among mobile devices, including standards that qualify as 1G, 2G, 3G, 4G, 5G, LTE, or the like. The network standards may qualify as one or more generations of mobile telecommunication standards by fulfilling a specification or standards such as the specifications maintained by the International Telecommunication Union. The 3G standards, for example, may correspond to the International Mobile Telecommunications-2000 (IMT-2000) specification, and the 4G standards may correspond to the International Mobile Telecommunications Advanced (IMT-Advanced) specification. Examples of cellular network standards include AMPS, GSM, GPRS, UMTS, HSPA, LTE, LTE Advanced, Mobile WiMAX, and WiMAX-Advanced. Cellular network standards may use various channel access methods, e.g., FDMA, TDMA, CDMA, or SDMA. In some embodiments, different types of data may be transmitted via different links and standards. In other embodiments, the same types of data may be transmitted via different links and standards.

The network 108 may be any type and/or form of network. The geographical scope of the network 108 may vary widely and the network 108 can be a body area network (BAN), a personal area network (PAN), a local-area network (LAN), e.g., Intranet, a metropolitan area network (MAN), or a wide area network (WAN), e.g., the Internet. The topology of the network 108 may be of any form and may include, e.g., any of the following: point-to-point, serial, bus, star, ring, mesh, or tree. The network 108 may be an overlay network which is virtual and sits on top of one or more layers of other networks. The network 108 may be of any such network topology as known to those ordinarily skilled in the art capable of supporting the operations described herein. The network 108 may utilize different techniques and layers or stacks of protocols, including, e.g., the Ethernet protocol, the Internet protocol suite (e.g., TCP/IP, UDP/IP, etc.), the ATM (Asynchronous Transfer Mode) technique, the SONET (Synchronous Optical Networking) protocol, or the SDH (Synchronous Digital Hierarchy) protocol. The TCP/IP Internet protocol suite may include application layer, transport layer, Internet layer (including, e.g., IPv6), or the link layer. The network 108 may be a type of a broadcast network, a telecommunications network, a data communication network, or a computer network.

In some implementations, one or more of users 102-1 through 102-N may access the AI agent system 106 (e.g., using one or more of user devices 104-1 through 104-N). The AI agent system 106 may include one or more user interfaces, such as browsers and textual or graphical user interfaces, through which users 102-1 through 102-N may access the AI agent system 106.

Figure 1C:
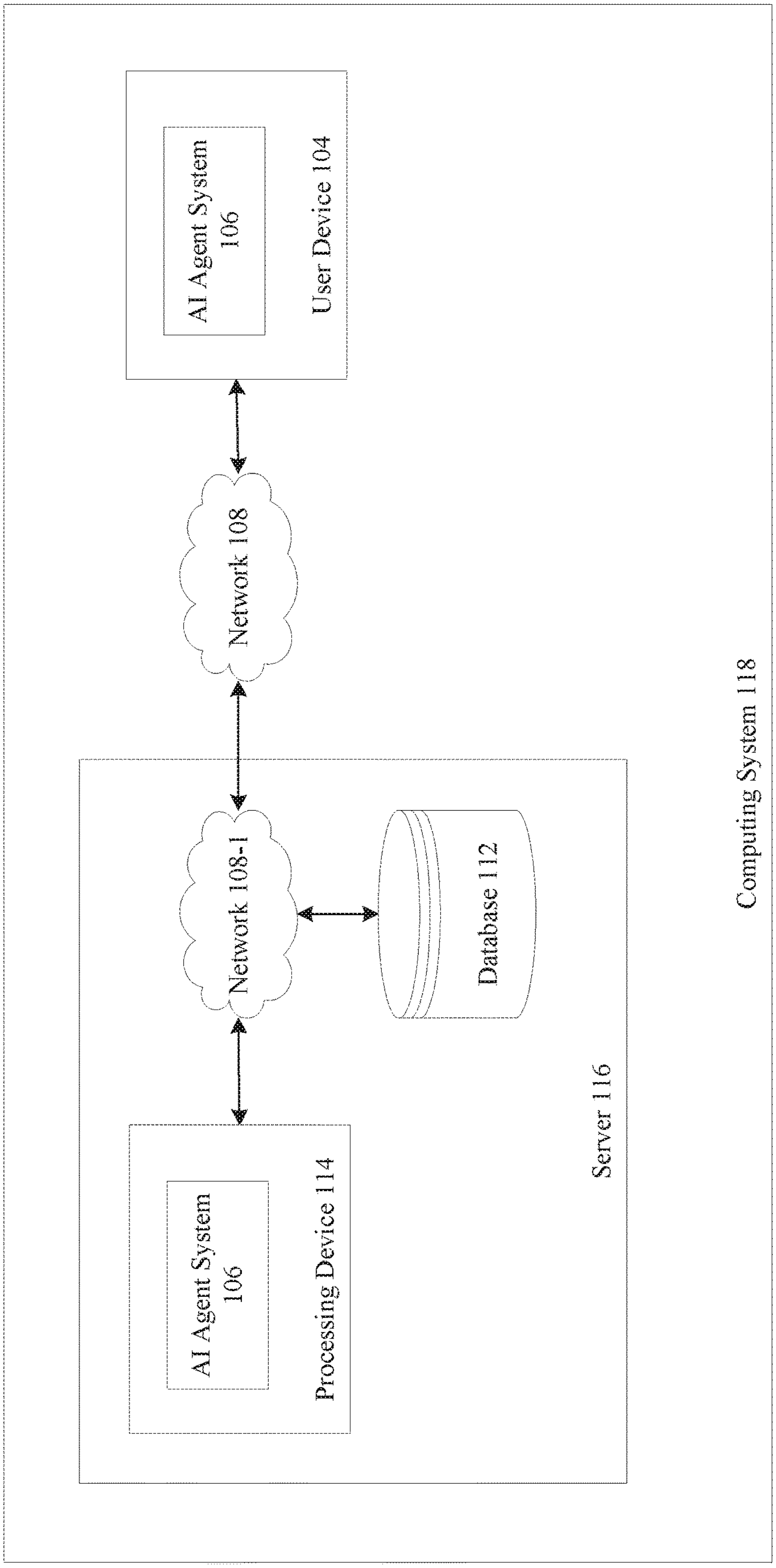
FIG. 1C is a block diagram that illustrates a first example of the AI agent system, according to certain embodiments.

FIG. 1C is a block diagram that illustrates a first example system 100C, in accordance with some embodiments of the present disclosure. As discussed herein, the AI agent system 106 may include logic that enables the operations and systems described herein when executed. In one embodiment, system 100C may be described as a computing system 118, including means for performing the operations described herein. In one embodiment, the AI agent system 106 resides in whole or in part on a computing system 118 of the system 100C. In another embodiment, the AI agent system 106 resides in whole or in part on an edge network device, such as a user device 104-1 through 104-N of system 100C. In yet another embodiment, the AI agent system 106 resides in whole or in part on any combination of the two or in a different system entirely.

The computing system 118 may include various components, which may allow the AI agent system 106 to run on a server device or user device 104. Each component may perform different functions, operations, actions, processes, methods, etc., for the embodiments described herein and/or may provide different services, functionalities, and/or resources for the embodiments described herein. As illustrated in FIG. 1C, computing system 118 includes the AI agent system 106, a processing device 114, a database 112, and a network 108. The AI agent system 106, the processing device 114, and the database 112 may be coupled to each other via network 108. Network 108 may be a public network, a private network, or a combination thereof. In one embodiment, network 108 may include a wired or a wireless infrastructure, which may be provided by one or more wireless communications systems, such as a Wi-Fi hotspot connected with the network 108 and/or a wireless carrier system that can be implemented using various data processing equipment, communication towers, etc. The network 108 may carry communications between the various components of computing system 118. The database 112 may be a persistent storage that is capable of storing data. A persistent storage may be a local storage unit or a remote storage unit. Persistent storage may be a magnetic storage unit, optical storage unit, solid state storage unit, electronic storage units (main memory), or similar storage unit. Persistent storage may also be a monolithic/single device or a distributed set of devices. Each component may include hardware such as processing devices (e.g., processors, central processing units (CPUs), graphics processing units (GPUs)), memory (e.g., random access memory (RAM)), storage devices (e.g., hard-disk drive (HDD), solid-state drive (SSD), etc.), and other hardware devices (e.g., sound card, video card, etc.). The computing system 118 may comprise any suitable type of computing device or machine that has a programmable processor including, for example, server computers, desktop computers, laptop computers, tablet computers, smartphones, set-top boxes, etc. In some examples, the computing system 118 may comprise a single machine or may include multiple interconnected machines (e.g., multiple servers configured in a cluster). The computing system 118 may be implemented by a common entity/organization or may be implemented by different entities/organizations.

Figure 1D:
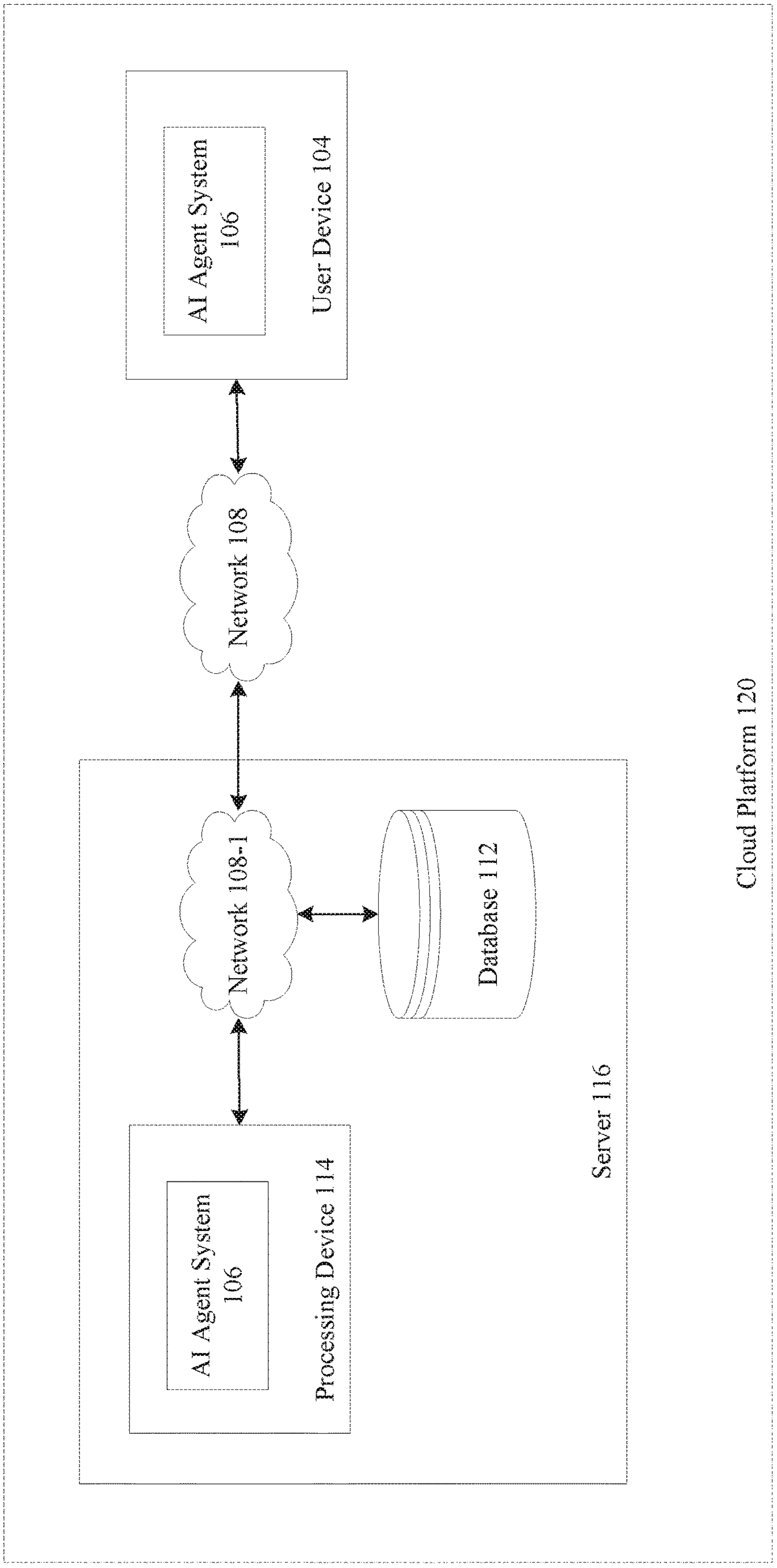
FIG. 1D is a block diagram that illustrates a second example of the AI agent system, according to certain embodiments.

FIG. 1D is a block diagram that illustrates a second example system 100D, in accordance with some embodiments of the present disclosure. System 100D includes a cloud platform 120, which may include one or more components. As discussed herein, AI agent system 106 may include logic that enables the operations and systems described herein when executed. In one embodiment, system 100D may be described as a cloud platform 120, including means for performing the operations described herein (e.g., server 116, network 108, user device 104, etc.). In one embodiment, AI agent system 106 resides in whole or in part on a server (e.g., server 116) of system 100D. In another embodiment, AI agent system 106 resides in whole or in part on a user device (e.g., user device 104) of system 100D. In yet another embodiment, AI agent system 106 resides in whole or in part on any combination of the two or in a different system entirely.

Server 116 may include various components, which may allow AI agent system 106 to run on a server device or user device 104. Each component may perform different functions, operations, actions, processes, methods, etc., for the embodiments described herein and/or may provide different services, functionalities, and/or resources for the embodiments described herein.

As illustrated in FIG. 1D, server 116 includes an AI agent system 106, a processing device 114, a database 112, and a network 108. The AI agent system 106, the processing device 114, and the database 112 may be coupled to each other via network 108. Network 108 may be a public network, a private network, or a combination thereof. In one embodiment, network 108 may include a wired or a wireless infrastructure, which may be provided by one or more wireless communications systems, such as a Wi-Fi hotspot connected with the network 108 and/or a wireless carrier system that can be implemented using various data processing equipment, communication towers, etc.

The network 108 may carry communications between the various components of server 116. The database 112 may be a persistent storage that is capable of storing data. Persistent storage may be a local storage unit or a remote storage unit. Persistent storage may be a magnetic storage unit, optical storage unit, solid-state storage unit, electronic storage units (main memory), or a similar storage unit. Persistent storage may also be a monolithic/single device or a distributed set of devices.

Each component may include hardware such as processing devices (e.g., processors, central processing units (CPUs), graphics processing units (GPUs)), memory (e.g., random access memory (RAM)), storage devices (e.g., hard-disk drive (HDD), solid-state drive (SSD), etc.), and other hardware devices (e.g., sound card, video card, etc.). The server 116 may comprise any suitable type of computing device or machine that has a programmable processor including, for example, server computers, desktop computers, laptop computers, tablet computers, smartphones, set-top boxes, etc. In some examples, the server 116 may comprise a single machine or may include multiple interconnected machines (e.g., multiple servers configured in a cluster). The server 116 may be implemented by a common entity/organization or may be implemented by different entities/organizations.

In one embodiment, server 116 is operably connected to user device 104 via network 108. Network 108 may be a public network, a private network, or a combination thereof. In one embodiment, network 108 may include a wired or a wireless infrastructure, which may be provided by one or more wireless communications systems, such as a Wi-Fi hotspot connected with the network 108 and/or a wireless carrier system that can be implemented using various data processing equipment, communication towers, etc. The network 108 may carry communications between the various components of system 100D. User device 104 may include AI agent system 106, in addition to, or alternatively from, server 116.

FIG. 1E is a block diagram that illustrates a third example system 100E, in accordance with some embodiments of the present disclosure. System 100E includes a cloud platform 120, which may include one or more components. As contemplated herein, the cloud platform 120 may represent any number of edge and/or central cloud platforms, which may include any number of components, such as edge and cloud applications, infrastructure services, workload orchestration components, virtualization components, and operating system components.

As discussed herein, the AI agent system 106 may include logic that enables the operations and systems described herein when executed. In one embodiment, system 100E may be described as a cloud platform 120, including means for performing the operations described herein, such as the server 116, network 108-1, and user device 104. In one embodiment, the AI agent system 106 resides in whole or in part on the server 116 of system 100E. In another embodiment, the AI agent system 106 resides in whole or in part on the user device 104 of system 100E. In yet another embodiment, the AI agent system 106 resides in whole or in part on any combination of the two, or in a different system entirely.

The server 116 may include various components, which may allow the AI agent system 106 to run on the server 116 or the user device 104. Each component may perform different functions, operations, actions, processes, and methods for the embodiments described herein and/or may provide different services, functionalities, and resources for the embodiments described herein.

As illustrated in FIG. 1C, the cloud platform 120 includes the AI agent system 106, the processing device 114, the database 112, and the network 108-1. The AI agent system 106, the processing device 114, and the database 112 may be coupled to each other via the network 108. The network 108-1 may be a public network, a private network, or a combination thereof. In one embodiment, network 108 may include a wired or a wireless infrastructure, which may be provided by one or more wireless communications systems, such as a Wi-Fi hotspot connected with the network 108-1 and/or a wireless carrier system that can be implemented using various data processing equipment, communication towers, etc.

The network 108-1 may carry communications, such as data, messages, packets, and frames, between the various components of the cloud platform 120 and/or between a variety of systems. The database 112 may be a persistent storage that is capable of storing data. A persistent storage may be a local storage unit or a remote storage unit. Persistent storage may be a magnetic storage unit, optical storage unit, solid-state storage unit, electronic storage units such as main memory, or a similar storage unit. Persistent storage may also be a monolithic/single device or a distributed set of devices.

Each component may include hardware such as processing devices, for example, processors, central processing units (CPUs), and graphical processing units (GPUs); memory, such as random access memory (RAM); storage devices, such as a hard-disk drive (HDD) and solid-state drive (SSD); and other hardware devices, such as sound cards and video cards. The cloud platform 120 may comprise any suitable type of computing device or machine that has a programmable processor, including, for example, server computers, desktop computers, laptop computers, tablet computers, smartphones, and set-top boxes. In some examples, the cloud platform 120 may comprise a single machine or may include multiple interconnected machines, such as multiple servers configured in a cluster. The cloud platform 120 may be implemented by a common entity/organization or may be implemented by different entities/organizations. For example, the cloud platform 120 may be operated by a first company/corporation, and a second cloud platform (not pictured) may be operated by a second company/corporation. Each server may execute or include an operating system (OS), as discussed in more detail below. The OS of the server may manage the execution of other components, such as software and applications, and/or may manage access to the hardware, such as processors, memory, and storage devices, of the computing device.

In one embodiment, the server 116 is operably connected to the user device 104 via the network 108. The network 108 may be a public network, such as the internet, a private network, such as a local area network (LAN) or wide area network (WAN), or a combination thereof. In one embodiment, network 108 may include a wired or a wireless infrastructure, which may be provided by one or more wireless communications systems, such as a Wi-Fi hotspot connected with the network 108 and/or a wireless carrier system that can be implemented using various data processing equipment, communication towers, etc. The network 108 may carry communications, such as data, messages, packets, and frames, between the various components of system 100E. The user device 104 may include the AI agent system 106, in addition to, or alternatively from, the server 116.

System Architecture

FIG. 2 illustrates an exemplary system 200 for simulated testing and benchmarking of an agentic AI system, in accordance with some embodiments of the present disclosure. The system 200 is configured to facilitate the autonomous execution of tasks by the agentic AI system 202 within a controlled synthetic environment 216, thereby eliminating reliance on external tools or real-world data sources. The system 200 further enables evaluation of the agentic AI system 202 under both normal and faulted operating conditions by generating a performance vector that quantitatively measures task completion rate, accuracy, efficiency, resilience, and recovery behavior.

The system 200 includes the agentic AI system 202, which comprises a plurality of operational agents collectively referred to as agents team 204. The agents team 204 includes one or more autonomous agents that interact and collaborate to perform distributed workflows. Each agent within the agents team 204 is designed to carry out a specific function within the overall task pipeline and is configured to issue programmatic requests through one or more tool-access interfaces 208. The tool-access interfaces 208 represent standardized communication endpoints through which the agents team 204 interacts with bound tools 206 or external tools 212 in standard deployments. The external tools 212 may include, by way of example and not limitation, file-system search utilities, retrieval-augmented generation (RAG) connectors, structured or unstructured database drivers, web application programming interfaces (APIs), or analytical services invoked through HTTP, gRPC, or similar communication protocols. In a typical operational environment, the agentic AI system 202 relies on these external tools 212 for acquiring, transforming, and processing information to achieve a specified task objective.

In one exemplary embodiment, the agents team 204 may include a Research Agent configured to issue retrieval queries, a Summarization Agent configured to condense lengthy textual inputs, an Analytical Agent configured to interpret and evaluate contextual data, a Validation Agent configured to assess consistency and correctness, and a Reporting Agent configured to compile and format results. Each of these agents interacts through a designated tool-access interface 208 corresponding to its required function. For instance, the Research Agent may interact through an interface configured as a REST endpoint to send a retrieval query, while the Analytical Agent may employ a database driver interface for executing analytical computations. Similarly, the Reporting Agent may use a document-rendering interface to generate formatted reports such as DOCX or PDF files.

Each tool-access interface 208 defines request and response schemas, data serialization formats, authentication protocols, and error-handling rules. These interfaces may be implemented as RESTful, SOAP, or GraphQL endpoints, or as local inter-process communication (IPC) connectors. In one example, a file-system interface may expose endpoints such as /list, /read, or /search, each accepting structured parameters such as directory paths or keywords and returning corresponding metadata or document content. A database interface may support SQL queries with result sets formatted as JSON, while an analytical API interface may process numerical inputs to return structured statistical summaries or confidence scores.

In the simulated configuration shown in FIG. 2, the simulation agent 210 is bound to one or more of the tool-access interfaces 208 to replace the external tools 212. The binding establishes a protocol-compatible connection that enables the simulation agent 210 to intercept each request emitted through the tool-access interfaces 208 and substitute a protocol-compliant response generated from synthetic data 214 and the synthetic environment 216. This replacement allows the agentic AI system 202 to operate normally, unaware that the responses are simulated rather than produced by live external tools 212. The simulation agent 210 thereby functions as a surrogate toolchain, ensuring seamless task execution during simulated testing and benchmarking.

The synthetic environment 216 constitutes a core component of the system 200 and is designed to emulate operational conditions, data behaviors, and response structures observed in live environments. By way of execution, the synthetic environment 216 performs the tasks requested by the agentic AI system 202 using synthetic data 214 and presents the results in a format identical to that produced by external tools 212. The synthetic environment 216 thereby acts as a bridge between the simulation layer and the agentic AI system 202, ensuring task continuity, behavioral realism, and repeatability during simulation.

In one embodiment, the synthetic environment 216 comprises virtualized compute nodes 218, simulated APIs 220, synthetic data repositories, simulated databases 222, and mock network interfaces 222. These components collectively reproduce behavioral, temporal, and contextual characteristics of operational systems.

The virtualized compute nodes 218 represent distributed execution entities configured to process requests and generate responses equivalent to those of production microservices. Each virtualized compute node 218 may simulate computational latency, throughput variation, and processing dependencies. In one example, the virtualized compute nodes 218 may host simulated inference engines or data transformation services corresponding to agents' tasks, such as analytical computation, feature extraction, or aggregation pipelines. The virtualized compute nodes 218 may also include containerized runtime environments configured with task schedulers and resource allocation policies to reproduce scaling behaviors of real-world deployments.

The simulated APIs 220 replicate network-based services that agents would typically invoke for retrieving or transforming data. These APIs adhere to standard protocol definitions such as REST, GraphQL, or SOAP and support authentication and throttling mechanisms including token-based access and rate limits. The simulated APIs 220 may emulate document summarization endpoints, natural language translation utilities, knowledge retrieval systems, or financial data streams. Each simulated API 220 introduces latency, response variability, and structured outputs to ensure realism in simulated interactions.

The synthetic data repositories serve as structured and unstructured data stores that hold synthetic data 214. The synthetic data 214 include files and datasets encoded in various formats such as CSV, JSON, XML, DOCX, and PDF. The synthetic data repositories are organized in a synthetic directory hierarchy mirroring real-world data architectures. Each record or document includes metadata attributes such as schema definitions, creation timestamps, and simulated access permissions. For example, the synthetic data repositories may store simulated financial statements for benchmarking a reporting workflow, or synthetic medical data for testing a clinical analysis system. The synthetic data repositories thereby allow secure and privacy-compliant testing by generating and providing realistic but non-sensitive data.

In one embodiment, the simulation agent 210 is configured to inject one or more faults into the synthetic environment 216 according to a predefined fault schedule that specifies temporal offsets, repetition intervals, and severity levels. The injected faults are selected from a group comprising file corruption, data truncation, record omission, network delay, protocol error, or erroneous human-input signaling. Each injected fault is designed to emulate realistic system disturbances that may occur during live operation, enabling the assessment of fault tolerance and recovery behavior of the agentic AI system 202. For example, file corruption may involve intentional alteration of data bytes within synthetic datasets, while data truncation or record omission may simulate incomplete database responses. Network delay and protocol error conditions are introduced through mock network interfaces to reproduce latency and transmission anomalies. Erroneous human-input signaling may be emulated through synthetic human-in-the-loop interactions that provide inaccurate or delayed feedback. The predefined fault schedule governs the timing, frequency, and intensity of these fault events, ensuring structured and repeatable evaluation of the agentic AI system's resilience, recovery efficiency, and adaptive response mechanisms under controlled fault conditions.

In one embodiment, the simulation agent 210 is further configured to enable privacy-compliant testing by generating and utilizing synthetic data 214 to avoid using sensitive or proprietary information. The simulation agent 210 autonomously collects structured and unstructured data from a plurality of data sources, including publicly available repositories, industry reports, research publications, and online content feeds. The collected data are processed through semantic abstraction and statistical modeling techniques to remove personally identifiable or confidential elements while preserving contextual integrity and distributional properties. The simulation agent 210 subsequently synthesizes the structured and unstructured data into realistic testing scenarios that emulate real-world and industry-specific operating conditions. These synthesized scenarios are integrated into the synthetic environment 216, ensuring that the agentic AI system 202 is evaluated under authentic operational contexts without exposing or transmitting any restricted or sensitive data. This configuration thereby ensures full compliance with data-privacy and security standards during simulation and benchmarking.

The synthetic data repositories emulate the structure and functionality of relational and non-relational database management systems. Each synthetic data repository implements a query parser capable of interpreting SQL-like queries and returning deterministic or randomized result sets. The schema may include synthetic tables representing employee records, inventory lists, or transaction logs, enabling agents to execute representative analytical or retrieval operations. Similarly, document-oriented simulation registry 224 return hierarchical data objects that mimic NoSQL query responses.

The mock network interfaces 222 are configured to replicate network communication characteristics encountered in operational systems. The mock network interfaces 222 can introduce controlled latency, bandwidth limitation, jitter, or packet loss to emulate real-world conditions. For instance, the mock network interfaces 222 may delay response transmission to simulate congested networks or induce protocol errors to test recovery and fault-tolerance mechanisms of the agentic AI system 202.

The synthetic environment 216 also supports simulated human-in-the-loop (HIL) interaction, enabling agents to engage in feedback-based communication similar to human supervision. The simulated HIL component can generate synthetic feedback signals such as approvals, corrections, or partial responses based on behavioral models derived from recorded human-agent interactions. For example, when a Validation Agent submits a result for approval, the synthetic environment 216 may generate a synthetic "revise and resubmit" feedback message, prompting the agent to adjust its output.

In one embodiment, the simulated environments replicate the conditions under which the agents team 204 typically operates. The simulated environments render a wide range of operational constructs, including but not limited to file structures, web content, application programming interfaces (APIs), databases, real-time data streams, and human-in-the-loop interactions. Each simulated component is designed to reproduce the structural, temporal, and contextual properties of real-world systems, allowing the agentic AI system 202 to perform tasks within a controlled yet realistic environment. The simulation agent 210 further injects, into the system, fault conditions for resilience testing of the agentic AI system 202. These injected faults include scenarios such as incomplete datasets, corrupted files, network interruptions, protocol anomalies, or erroneous human feedback signals, each governed by a predefined fault schedule to emulate authentic system disturbances. Following the simulated execution, the simulation agent 210 benchmarks the performance of the agentic AI system 202 by measuring task completion rates, accuracy, efficiency, system resilience, and fault-recovery capabilities. The benchmarking process evaluates outcomes against predefined tasks and objectives under both healthy and fault-inserted scenarios, ensuring comprehensive performance assessment across operational, degraded, and recovery conditions.

During operation, the simulation agent 210 coordinates with the synthetic environment 216 to process and fulfill all requests issued by the agentic AI system 202. Each request transmitted through a tool-access interface 208 is executed within the synthetic environment 216 using corresponding synthetic data 214 or simulated computational resources. For example, when the Research Agent requests access to a data corpus, the simulation agent 210 retrieves relevant documents from the synthetic data repositories 221 and applies simulated semantic search functions. Similarly, when the Analytical Agent performs a query, the simulation registry 224 and virtualized compute nodes 218 collaboratively execute the analytical task and return a synthesized response.

In accordance with an embodiment, the simulation controller 214 provides centralized orchestration and oversight for the simulation agent 210 and the synthetic environment 216. The simulation controller 214 mainly includes, but may not be limited to, a simulation registry 224, a configuration manager 226, and a policy engine 228. The simulation controller 214 maintains a simulation registry 224 that stores metadata for all simulated tools, schema definitions, configuration parameters, and execution logs. The simulation controller 214 dynamically updates the simulation registry 224 based on prior simulation outcomes to improve fidelity, reproducibility, and coverage of simulated scenarios. In one embodiment, the simulation controller 214 applies reinforcement-learning policies through a policy engine 228 to allocate computational resources among multiple simulation agents according to reward scores derived from task accuracy, efficiency, or runtime performance.

The simulation controller 214 may also operate the configuration manager 226 that adjusts simulation parameters, including latency, fault intensity, and network throughput, ensuring alignment with benchmark configurations. The configuration manager 226 serves as a dynamic orchestration component responsible for regulating the operational attributes of the synthetic environment 216 throughout simulation and benchmarking cycles. In one embodiment, the configuration manager 226 continuously monitors execution metrics, such as task completion time, error frequency, and network utilization, to maintain controlled experimental conditions. The configuration manager 226 dynamically tunes simulation parameters across the virtualized compute nodes 218, simulated APIs 220, synthetic repositories 221, and mock network interfaces 223 to achieve consistency with predefined benchmark scenarios. For instance, the configuration manager 226 may increase network latency to emulate bandwidth congestion, reduce compute resource allocation to simulate load balancing constraints, or adjust fault injection frequency to mirror real-world failure distributions. By adapting these parameters in real time, the configuration manager 226 ensures that each simulation run accurately replicates the temporal and operational dynamics of target deployment environments while maintaining reproducibility across successive tests.

In one aspect, the simulation controller 214 further includes a policy engine 228 configured to govern resource distribution, scheduling, and optimization strategies across concurrent simulation agents and processes. The policy engine 228 implements reinforcement-learning-based decision frameworks to allocate computational resources, manage task priorities, and determine optimal execution paths within the synthetic environment 216. Each policy enforced by the policy engine 228 is trained on historical performance data and reward signals derived from prior benchmarking results, enabling adaptive optimization over time. For example, the policy engine 228 may allocate additional compute bandwidth to a simulation agent demonstrating higher task accuracy or reassign workloads from underperforming nodes to more efficient ones. The policy engine 228 also coordinates with the configuration manager 226 to maintain equilibrium between simulation fidelity and computational efficiency. Through this coordination, the policy engine 228 ensures that resource allocation policies dynamically evolve to enhance simulation throughput, accuracy, and scalability, thereby improving overall system efficiency and ensuring optimal utilization of synthetic environment resources across all simulation cycles.

Further, in accordance with the embodiment, the benchmarking evaluator 232 is connected to the synthetic environment 216. Upon completion of task execution at the synthetic environment 216, the benchmarking evaluator 232 receives and analyzes the outcomes from both the healthy and faulted execution paths. The benchmarking evaluator 232 generates a performance vector representing quantitative and qualitative metrics such as task completion rate, accuracy, latency, resilience, and fault recovery. Each metric is accompanied by recorded rationales for traceability and stored within a secured simulation dataset 234. The benchmarking evaluator 232 may further employ statistical or AI-based methods to measure semantic alignment between predicted and expected outcomes, enabling comprehensive benchmarking of the agentic AI system 202.

In another embodiment, the system 200 supports a stealth observation mode for data acquisition and self-training. In this mode, the simulation agent 210 is deployed in a live agentic environment alongside operational agents and bound tools 206. The simulation agent 210 passively observes communications between agents and tools, capturing invocation traces, context tokens, and response payloads without altering the state or message structure of the live system. The captured traces are stored within the secured simulation dataset 234 and used to train surrogate models that emulate observed tool behavior. These surrogate models are subsequently integrated into the synthetic environment 216, enabling closed-loop autonomous simulation of production-grade behavior without external dependencies.

The system 200 further incorporates an autonomous feedback pipeline within the simulation controller 214 that continuously integrates evaluation results, synthetic data augmentations, and tool emulation parameter updates. The feedback pipeline functions as a self-adaptive loop that refines simulation accuracy and behavioral fidelity over successive runs. It aggregates performance metrics generated by the benchmarking evaluator 232, including accuracy, latency, and resilience, and uses these results to recalibrate simulation parameters and execution thresholds. The feedback pipeline also introduces synthetic data augmentations derived from new structured and unstructured data sources to keep the synthetic environment 216 aligned with evolving operational contexts. In addition, it updates tool emulation parameters-such as API latency, schema structures, and surrogate model outputs-based on observed deviations from live tool behavior. Through these continuous refinements, the autonomous feedback pipeline maintains convergence between the simulated environment 216 and live agentic AI environments, ensuring persistent alignment, realism, and technical consistency during simulation and benchmarking cycles.

In an additional embodiment, the simulation agent 210 autonomously retrieves structured and unstructured information from publicly available online resources, including news articles, whitepapers, blogs, and social-media content, to synthesize domain-specific testing scenarios. The simulation controller 214 schedules auto-refresh cycles based on content update frequency, concept drift, or time-based thresholds, ensuring continuous renewal of synthetic data 214 and simulated environments.

Through these configurations, the system 200 functions as a comprehensive, privacy-compliant simulation and benchmarking framework that replaces external dependencies with the synthetic environment 216. The system 200 performs computational, contextual, and human-interaction functions necessary for evaluating multi-agent workflows. By integrating the simulation agent 210, simulation controller 214, configuration manager 226, policy engine 228, fault injector 230, benchmarking evaluator 232, simulation registry 224, and secured simulation dataset 234, the system 200 provides a unified architecture for testing, evaluating, and refining agentic AI systems under realistic yet controlled operational conditions.

Figure 3:
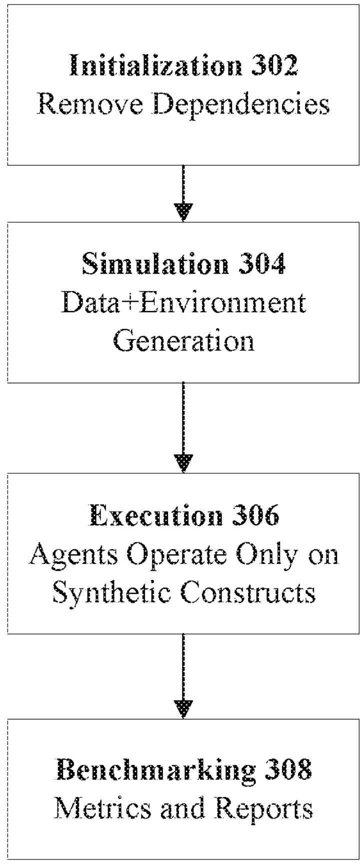
FIG. 3 illustrates an exemplary workflow for initialization, simulation, execution, and benchmarking of the agentic AI system, according to certain embodiments.

FIG. 3 illustrates an exemplary workflow 300 for initialization, simulation, execution, and benchmarking of the agentic AI system 202, in accordance with some embodiments of the present disclosure. The workflow 300 represents the procedural operation of the simulation framework introduced in FIG. 2 and details the sequence of stages through which an agentic AI system undergoes dependency removal, synthetic environment preparation, task execution, and performance evaluation. The workflow 300 enables end-to-end validation of agentic operations in a synthetic environment, ensuring that the system functions autonomously without reliance on external tools or live data sources.

At step 302, initialization is performed under the supervision of the simulation controller 214. During initialization, configuration parameters stored in the simulation registry 224 are retrieved, including schema definitions, simulated tool metadata, and pre-existing model weights. The simulation controller 214 instantiates the simulation agent 210 and binds it to one or more tool-access interfaces 208 of the agentic AI system 202. This initialization process also includes loading baseline performance thresholds, defining evaluation metrics, and registering the virtual components of the synthetic environment 216. The initialization stage removes dependencies by deactivating live connectors to external tools 212 and replacing them with synthetic connectors prepared for simulation, thereby isolating the system from live data exchange.

At step 304, simulation generation is initiated. This phase involves simultaneous construction of synthetic data 214 and the synthetic environment 216 required for downstream execution. The simulation controller 214 invokes the configuration manager 226 to provision virtualized compute nodes 218, simulated APIs 220, synthetic repositories 221, simulated databases 222, and mock network interfaces 223. Each of these components is populated or parameterized with synthetic content reflecting the operational domain of the agentic AI system 202. For example, synthetic data 214 may include structured records encoded as CSV or JSON files representing product inventories, transactions, or reports, and unstructured content such as DOCX or PDF documents replicating textual and graphical information typically consumed by the system in production. The synthetic environment 216 is configured to mirror expected runtime behavior, including latency, throughput, and network topology, ensuring that simulated interactions between the agents team 204 and the environment remain indistinguishable from live scenarios.

At step 306, the agentic AI system 202 begins execution within the synthetic environment 216. Each agent of the agents team 204—such as a Research Agent, Summarization Agent, Reasoning Agent, Validation Agent, or Report Generation Agent-operates exclusively on synthetic constructs generated during the simulation stage. Requests emitted through the tool-access interfaces 208 are intercepted by the simulation agent 210, processed using synthetic data 214, and executed via simulated components of the environment 216. For instance, a Research Agent may retrieve simulated documents through a REST-based API 220, while a Reasoning Agent performs logical inference over a synthetic dataset hosted on a simulated database 222. The mock network interfaces 222 apply controlled latency or error conditions to evaluate the fault-handling capabilities of the system. Throughout execution, the simulation controller 214 monitors task progress and records agent-tool interactions within the simulation registry 224 for later benchmarking.

At step 308, benchmarking is performed by the benchmarking evaluator 232. The benchmarking evaluator 232 computes and reports a comprehensive performance vector based on outputs collected during execution. The performance vector includes task completion rate, accuracy, latency, efficiency, system resilience, and fault-recovery metrics. Each metric is accompanied by contextual annotations produced by the AI-based evaluator 236 to provide interpretability and traceability. In one embodiment, benchmarking also includes comparative evaluation between a healthy run path and a fault-inserted run path, as described with reference to FIG. 2. The benchmarking evaluator 232 generates a structured report containing statistical charts, confidence intervals, and descriptive analyses summarizing the agentic AI system's performance within the synthetic environment 216. These benchmarking reports are archived within the secured simulation dataset 234 and optionally exported for training reinforcement policies or updating configuration parameters through the policy engine 228. In one embodiment, the simulation agent 210 exports simulation artifacts, including synthetic datasets, trained surrogate tool models, and evaluation summaries, to a simulation dataset for reuse in subsequent training and verification of agentic AI systems. The exported artifacts collectively represent the outcomes and learned parameters derived from prior simulation runs, encompassing data structures, surrogate behavioral models, and performance evaluation metrics.

Method

Figure 4A:
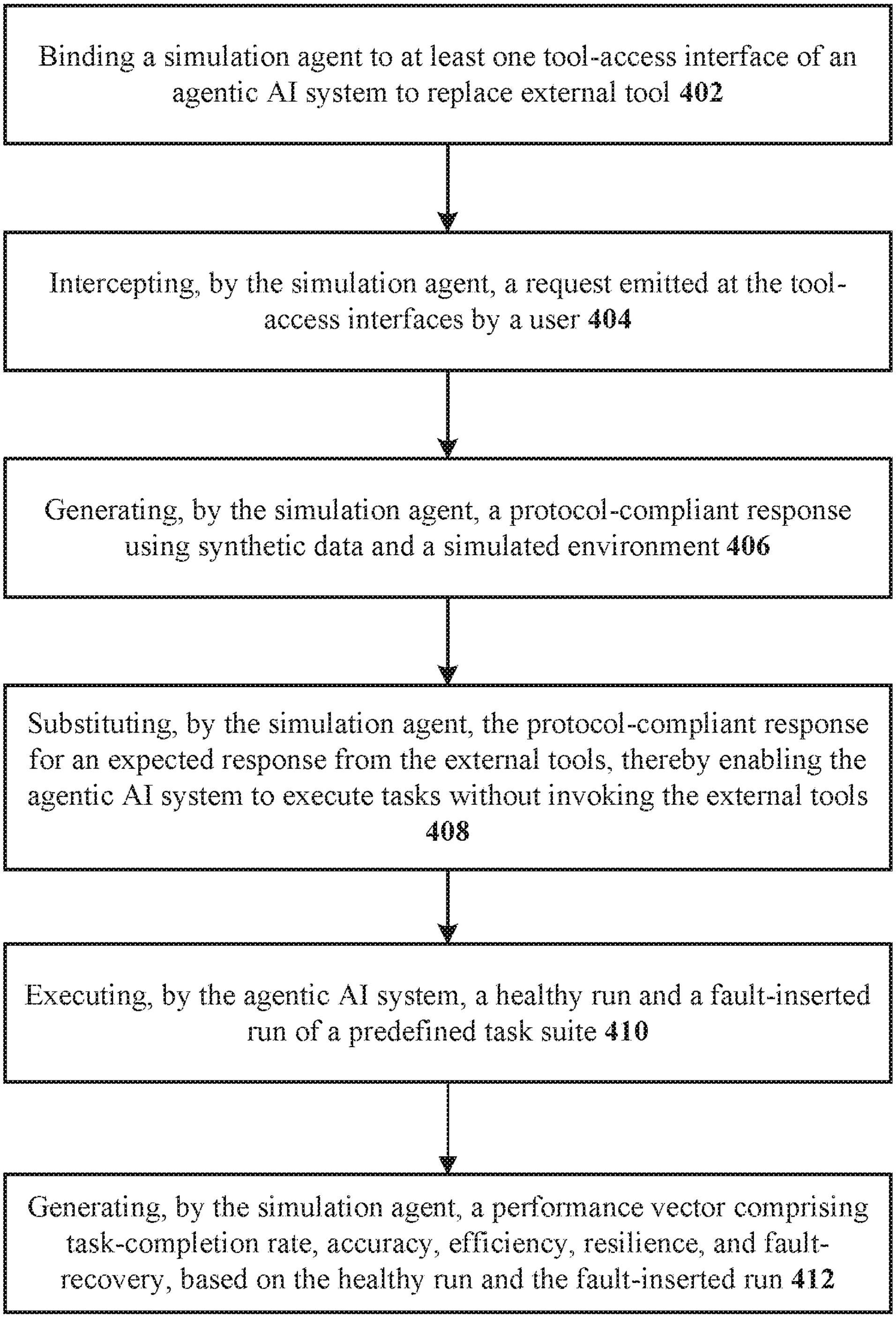
FIG. 4A illustrates an exemplary flow chart depicting a method for simulation-based execution of an agentic AI system, according to certain embodiments.

FIG. 4A illustrates an exemplary flow chart depicting a method for simulation-based execution of an agentic AI system, in accordance with an embodiment of the present disclosure. The method illustrated in FIG. 4A describes how a simulation agent replaces external tools, enables autonomous task execution, and generates performance metrics for benchmarking within a controlled synthetic environment.

At step 402, binding a simulation agent to at least one tool-access interface of an agentic AI system to replace external tools. The binding process establishes a protocol-compatible link that allows the simulation agent to intercept requests originally destined for live tools and to handle them internally using simulated resources. The binding operation may involve redirecting file-system calls, database connectors, retrieval-augmented generation (RAG) endpoints, or API interfaces to the simulation agent's control layer. In one example, the simulation agent binds to an HTTP endpoint that would normally access an external knowledge retrieval system, substituting the connection with an internally hosted simulated API. This replacement ensures seamless operation of the agentic AI system without altering its native logic or execution sequence.

At step 404, intercepting, by the simulation agent, a request emitted at the tool-access interfaces by a user or an operational agent within the agentic AI system. Each intercepted request includes details such as payload type, data schema, query parameters, and response expectations. The simulation agent records these requests in a simulation registry for traceability and further processing. For example, when a Research Agent attempts to access an external database to retrieve documents, the simulation agent intercepts the request, parses the payload, and prepares to respond using synthetic data generated within the synthetic environment.

At step 406, generating, by the simulation agent, a protocol-compliant response using synthetic data and a simulated environment. The simulation agent executes the intercepted request within a virtualized framework comprising simulated APIs, synthetic datasets, and mock computational nodes. In one embodiment, when a Summarization Agent requests textual content from a retrieval tool, the simulation agent invokes a simulated summarization API to construct a contextually relevant response derived from pre-generated synthetic documents. The responses are formatted in accordance with the schema expected by the requesting agent, thereby ensuring transparent substitution.

At step 408, substituting, by the simulation agent, the protocol-compliant response for an expected response from the external tools. This substitution allows the agentic AI system to continue its execution as if interacting with live tools, while operating exclusively on synthetic constructs. For example, a simulated database may return structured query results representing synthetic financial transactions, while a simulated API may provide a generated analytical report. The substitution layer ensures data type and format compliance with the agentic AI system's native toolchain specifications and behaviour.

At step 410, executing, by the agentic AI system, a healthy run and a fault-inserted run of a predefined task suite. The healthy run represents normal execution conditions, while the fault-inserted run includes controlled disturbances introduced by the fault injector to evaluate system resilience. Fault conditions may include corrupted input data, missing files, incomplete network responses, or incorrect human feedback signals. Each execution path is monitored by the simulation controller, which records execution time, resource utilization, and task-level success metrics.

At step 412, generating, by the simulation agent, a performance vector at least one performance characteristic, comprising task-completion rate, accuracy, efficiency, resilience, and fault-recovery based on the healthy run and the fault-inserted run. The performance vector quantitatively represents system behavior under normal and degraded conditions and is used to benchmark the agentic AI system's robustness. In one example, the benchmarking evaluator computes task success percentages and latency differentials between the two runs, while an AI-based evaluator correlates semantic correctness between the expected and generated results. The resulting performance vector, stored within a secured simulation dataset, serves as a reference for continuous improvement and calibration of simulation parameters.

Figure 4B:
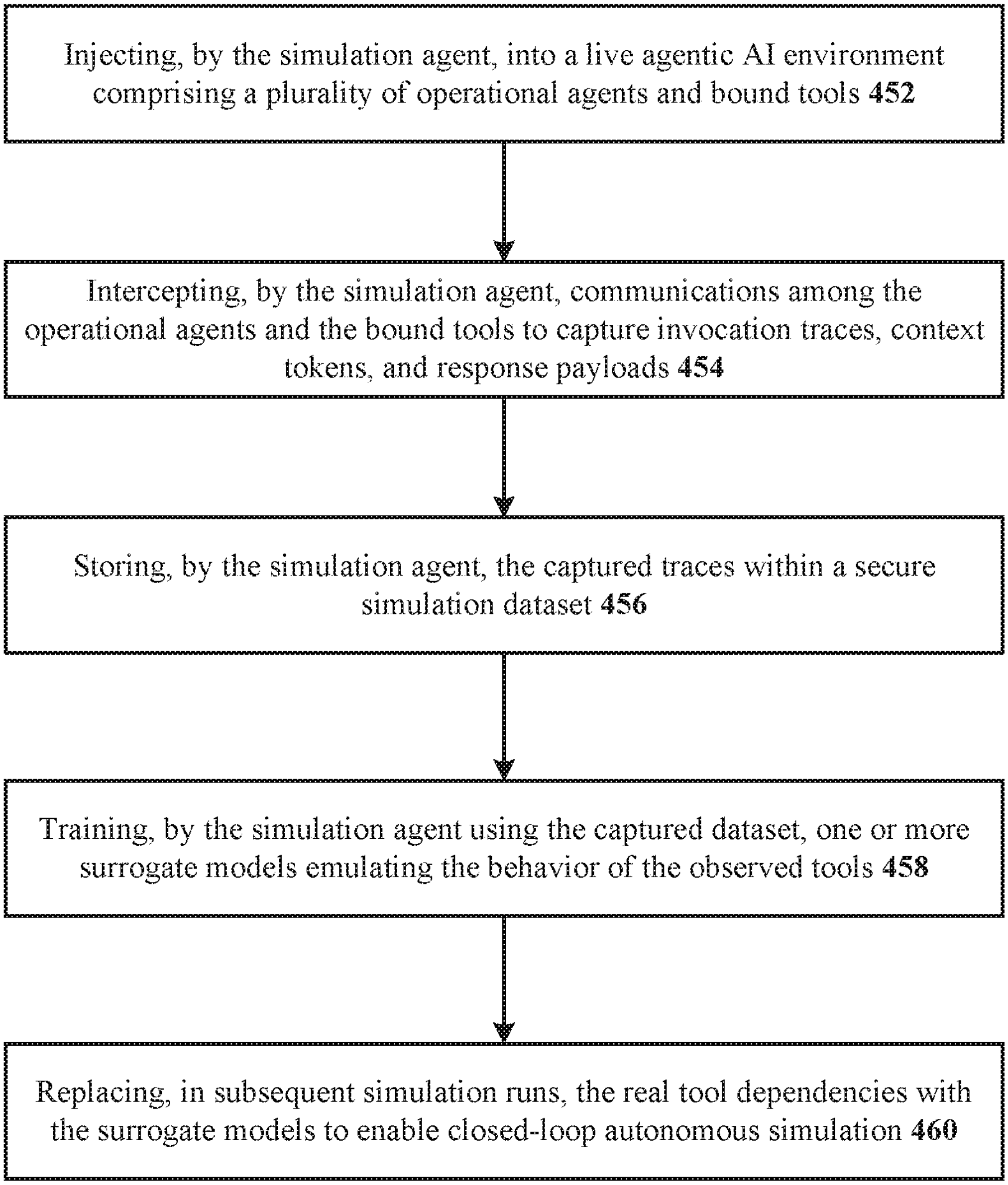
FIG. 4B illustrates an exemplary flow chart depicting a method for stealth observation and surrogate model training for tool behavior emulation, according to certain embodiments.

FIG. 4B illustrates an exemplary flow chart depicting a method for stealth observation and surrogate model training for tool behavior emulation, in accordance with an embodiment of the present disclosure. The method illustrated in FIG. 4B describes how the simulation agent observes live interactions between operational agents and tools, captures data traces, and uses them to train surrogate models that replicate real-world tool behaviors within the synthetic environment.

At step 452, injecting, by the simulation agent, into a live agentic AI environment comprising a plurality of operational agents and bound tools. The injection process involves deploying the simulation agent in a passive monitoring mode without altering system state or communication flow. The simulation agent operates with non-intrusive instrumentation, ensuring that it does not affect timing, data integrity, or security of the live environment. In one embodiment, the simulation agent is embedded as a proxy layer between agents and tools, enabling full observation of bidirectional traffic without direct modification of the application code.

At step 454, intercepting, by the simulation agent, communications among the operational agents and the bound tools to capture invocation traces, context tokens, and response payloads. The intercepted communication data may include API call sequences, query-response pairs, timestamps, authorization headers, and serialized data structures. These invocation traces are annotated with contextual identifiers corresponding to the originating agent and task type. For example, when a Retrieval Agent queries a knowledge API for document summaries, the simulation agent records the entire request and response cycle, including latency and response size.

At step 456, storing, by the simulation agent, the captured traces within a secured simulation dataset. The secured simulation dataset is maintained in an encrypted storage subsystem to prevent exposure of sensitive or proprietary data. Each stored record is indexed by tool type, query schema, and response pattern, enabling efficient retrieval during model training or fidelity analysis. The storage framework supports cryptographic hashing and version control, ensuring data lineage and reproducibility across multiple observation sessions.

At step 458, training, by the simulation agent using the captured dataset, one or more surrogate models emulating the behavior of the observed tools. The surrogate models are implemented as neural network architectures or rule-based simulators designed to reproduce the statistical and semantic characteristics of tool responses. Training may involve supervised learning, reinforcement learning, or hybrid modeling approaches. For instance, a surrogate model trained on captured API traces may learn to predict textual or numerical responses consistent with those of the original API under equivalent query conditions.

At step 460, replacing, in subsequent simulation runs, the real tool dependencies with the surrogate models to enable closed-loop autonomous simulation. In this configuration, the simulation agent no longer requires connection to live external tools. Instead, requests from the agentic AI system are directed to the trained surrogate models, which respond with high-fidelity outputs indistinguishable from live responses. The surrogate models thus serve as functional equivalents of production tools, allowing repeated, controlled simulation of real-world scenarios without privacy or dependency risks.

Computer Architecture

Figure 5:
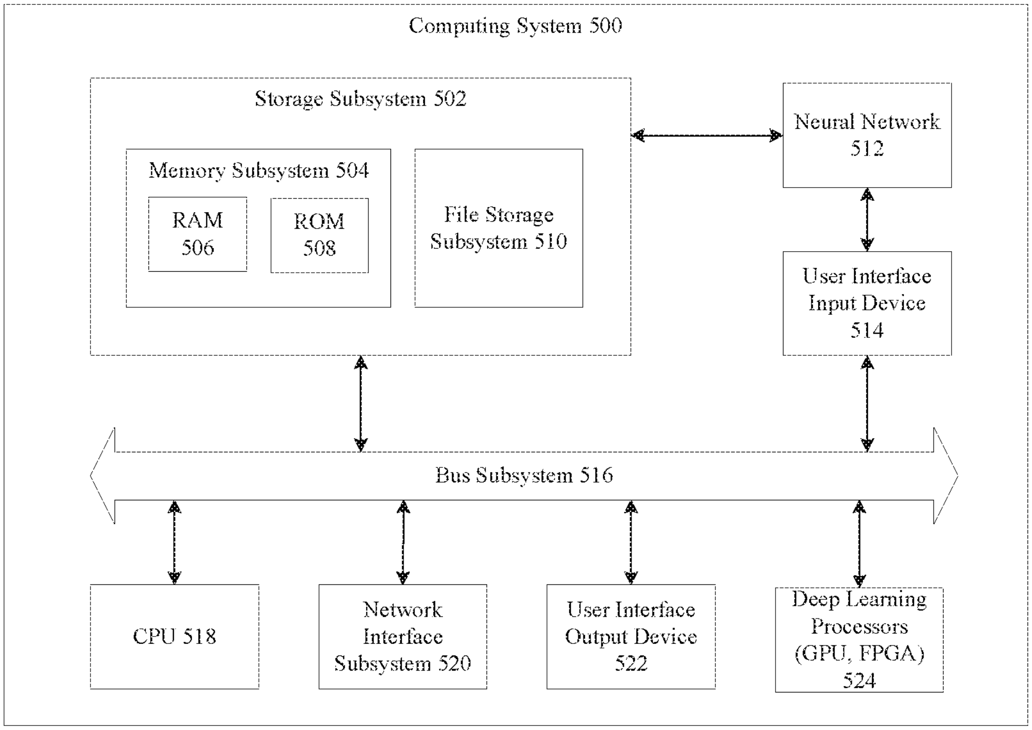
FIG. 5 illustrates an exemplary computer system suitable for implementing the multi-agent refinement technology, according to certain embodiments.

FIG. 5 shows an example computer system 500 that can be used to implement the technology disclosed. The computer system 500 is a representation of the automated proxy voting system 202, as described in FIG. 2. The computer system 500 includes at least one central processing unit (CPU) 518 that communicates with a number of peripheral devices via bus subsystem 516. These peripheral devices can include a storage subsystem 502 including, for example, memory devices and a file storage subsystem 510, user interface input devices 514, user interface output devices 522, and a network interface subsystem 520. The input and output devices allow user interaction with computer system 500. Network interface subsystem 520 provides an interface to outside networks, including an interface to corresponding interface devices in other computer systems.

In one implementation, a neural network 512 is communicably linked to the storage subsystem 502 and the user interface input devices 514.

User interface input devices 514 can include a keyboard; pointing devices such as a mouse, trackball, touchpad, or graphics tablet; a scanner; a touch screen incorporated into the display; audio input devices such as voice recognition systems and microphones; and other types of input devices. In general, use of the term "input device" is intended to include all possible types of devices and ways to input information into computer system 500.

User interface output devices 522 can include a display subsystem, a printer, a fax machine, or non-visual displays such as audio output devices. The display subsystem can include an LED display, a cathode ray tube (CRT), a flat-panel device such as a liquid crystal display (LCD), a projection device, or some other mechanism for creating a visible image. The display subsystem can also provide a non-visual display such as audio output devices. In general, use of the term "output device" is intended to include all possible types of devices and ways to output information from computer system 500 to the user or to another machine or computer system.

Storage subsystem 502 stores programming and data constructs that provide the functionality of some or all of the modules and methods described herein. These software modules are generally executed by deep learning processors 524.

Deep learning processors 524 can be graphics processing units (GPUs), field-programmable gate arrays (FPGAs), application-specific integrated circuits (ASICs), and/or coarse-grained reconfigurable architectures (CGRAs). Processors 524 can be hosted by a deep learning cloud platform such as Google Cloud Platform™, Xilinx™, and Cirrascale™. Examples of processors 524 include Google's Tensor Processing Unit (TPU)™, rackmount solutions like GX4 Rackmount Series™, GX6 Rackmount Series™, NVIDIA DGX-1™, Microsoft's Stratix V FPGA™, Graphcore's Intelligent Processor Unit (IPU)™, Qualcomm's Zeroth Platform™ with Snapdragon Processors™, NVIDIA's Volta™, NVIDIA's DRIVE PX™, NVIDIA's JETSON TX1/TX2 MODULE™, Intel's Nirvana™, Movidius VPU™, Fujitsu DPI™, ARM's DynamicIQ™, IBM TrueNorth™, Lambda GPU Server with Testa V100s™, and others.

Memory subsystem 504 used in the storage subsystem 502 can include a number of memories including a main random-access memory (RAM) 506 for storage of instructions and data during program execution and a read only memory (ROM) 508 in which fixed instructions are stored. A file storage subsystem 510 can provide persistent storage for program and data files, and can include a hard disk drive, a floppy disk drive along with associated removable media, a CD-ROM drive, an optical drive, or removable media cartridges. The modules implementing the functionality of certain implementations can be stored by file storage subsystem 510 in the storage subsystem 502, or in other machines accessible by the processor.

Bus subsystem 516 provides a mechanism for letting the various components and subsystems of computer system 500 communicate with each other as intended. Although bus subsystem 516 is shown schematically as a single bus, alternative implementations of the bus subsystem can use multiple buses.

Computer system 500 itself can be of varying types including a personal computer, a portable computer, a workstation, a computer terminal, a network computer, a television, a mainframe, a server farm, a widely distributed set of loosely networked computers, or any other data processing system or user device. Due to the ever-changing nature of computers and networks, the description of computer system 500 depicted in FIG. 5 is intended only as a specific example for the purpose of illustrating the preferred implementations of the present technology disclosed. Many other configurations of computer system 500 are possible having more or fewer components than the computer system depicted in FIG. 5.

In various implementations, a learning system is provided. In some implementations, a feature vector is provided to a learning system. Based on the input features, the learning system generates one or more outputs. In some implementations, the output of the learning system is a feature vector. In some implementations, the learning system comprises an SVM. In other implementations, the learning system comprises an artificial neural network. In some implementations, the learning system is pre-trained using training data. In some implementations training data is retrospective data. In some implementations, the retrospective data is stored in a data store. In some implementations, the learning system may be additionally trained through manual curation of previously generated outputs.

In some implementations, an object detection pipeline is a trained classifier. In some implementations, the trained classifier is a random decision forest. However, it will be appreciated that a variety of other classifiers are suitable for use according to the present disclosure, including linear classifiers, support vector machines (SVM), or neural networks such as recurrent neural networks (RNN).

Suitable artificial neural networks include but are not limited to a feedforward neural network, a radial basis function network, a self-organizing map, learning vector quantization, a recurrent neural network, a Hopfield network, a Boltzmann machine, an echo state network, long short term memory, a bi-directional recurrent neural network, a hierarchical recurrent neural network, a stochastic neural network, a modular neural network, an associative neural network, a deep neural network, a deep belief network, a convolutional neural networks, a convolutional deep belief network, a large memory storage and retrieval neural network, a deep Boltzmann machine, a deep stacking network, a tensor deep stacking network, a spike and slab restricted Boltzmann machine, a compound hierarchical-deep model, a deep coding network, a multilayer kernel machine, or a deep Q-network.

The present disclosure may be embodied as a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer system/server may be described in the general context of computer system-executable instructions, such as program modules, being executed by a computer system. Generally, program modules may include routines, programs, objects, components, logic, data structures, and so on that perform particular tasks or implement particular abstract data types. Computer system/server may be practiced in distributed computing environments where tasks are performed by remote processing devices that are linked through a communications network. In a distributed computing environment, program modules may be located in both local and remote computer system storage media including memory storage devices.

As shown in FIG. 5, computer system/server in computing node 700 is shown in the form of a general-purpose computing device. The components of computer system/server may include, but are not limited to, one or more processors or processing units, a system memory, and a bus that couples various system components including system memory to processor.

The bus represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, Peripheral Component Interconnect (PCI) bus, Peripheral Component Interconnect Express (PCIe), and Advanced Microcontroller Bus Architecture (AMBA).

Computer system/server typically includes a variety of computer system readable media. Such media may be any available media that is accessible by computer system/server, and it includes both volatile and non-volatile media, removable and non-removable media.

System memory can include computer system readable media in the form of volatile memory, such as random access memory (RAM) and/or cache memory. Algorithm Computer system/server may further include other removable/non-removable, volatile/non-volatile computer system storage media. By way of example only, storage system can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus by one or more data media interfaces. As will be further depicted and described below, memory may include at least one program product having a set (e.g., at least one) of program modules that are configured to carry out the functions of embodiments of the disclosure.

Program/utility, having a set (at least one) of program modules, may be stored in memory by way of example, and not limitation, as well as an operating system, one or more application programs, other program modules, and program data. Each of the operating system, one or more application programs, other program modules, and program data or some combination thereof, may include an implementation of a networking environment. Program modules generally carry out the functions and/or methodologies of embodiments as described herein.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some implementations, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to implementations of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various implementations of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Artificial Intelligence System Implementation

The system described in conjunction with FIG. 2 comprises one or more subsystems based on Artificial Intelligence. Implementation of the subsystems based on the Artificial Subsystems is illustrated by FIGS. 6 to 16.

Some implementations of the technology disclosed relate to using a Transformer model to provide an AI system. In particular, the technology disclosed proposes a parallel input, parallel output (PIPO) AI system based on the Transformer architecture. The Transformer model relies on a self-attention mechanism to compute a series of context-informed vector-space representations of elements in the input sequence and the output sequence, which are then used to predict distributions over subsequent elements as the model predicts the output sequence element-by-element. Not only is this mechanism straightforward to parallelize, but as each input's representation is also directly informed by all other inputs' representations, this results in an effectively global receptive field across the whole input sequence. This stands in contrast to, e.g., convolutional architectures which typically only have a limited receptive field.

In one implementation, the disclosed AI system is a multilayer perceptron (MLP). In another implementation, the disclosed AI system is a feedforward neural network. In yet another implementation, the disclosed AI system is a fully connected neural network. In a further implementation, the disclosed AI system is a fully convolution neural network. In a yet further implementation, the disclosed AI system is a semantic segmentation neural network. In a yet another further implementation, the disclosed AI system is a generative adversarial network (GAN) (e.g., CycleGAN, StyleGAN, pixelRNN, text-2-image, DiscoGAN, IsGAN). In a yet another implementation, the disclosed AI system includes self-attention mechanisms like Transformer, Vision Transformer (ViT), Bidirectional Transformer (BERT), Detection Transformer (DETR), Deformable DETR, UP-DETR, DeiT, Swin, GPT, iGPT, GPT-2, GPT-3, various ChatGPT versions, various LLaMA versions, BERT, SpanBERT, RoBERTa, XLNet, ELECTRA, UniLM, BART, T5, ERNIE (THU), KnowBERT, DeiT-Ti, DeiT-S, DeiT-B, T2T-ViT-14, T2T-ViT-19, T2T-ViT-24, PVT-Small, PVT-Medium, PVT-Large, TNT-S, TNT-B, CPVT-S, CPVT-S-GAP, CPVT-B, Swin-T, Swin-S, Swin-B, Twins-SVT-S, Twins-SVT-B, Twins-SVT-L, Shuffle-T, Shuffle-S, Shuffle-B, XCiT-S12/16, CMT-S, CMT-B, VOLO-D1, VOLO-D2, VOLO-D3, VOLO-D4, MoCo v3, ACT, TSP, Max-DeepLab, VisTR, SETR, Hand-Transformer, HOT-Net, METRO, Image Transformer, Taming transformer, TransGAN, IPT, TTSR, STTN, Masked Transformer, CLIP, DALL-E, Cogview, UniT, ASH, TinyBert, FullyQT, ConvBert, FCOS, Faster R-CNN+FPN, DETR-DC5, TSP-FCOS, TSP-RCNN, ACT+MKDD (L=32), ACT+MKDD (L=16), SMCA, Efficient DETR, UP-DETR, UP-DETR, ViTB/16-FRCNN, ViT-B/16-FRCNN, PVT-Small+RetinaNet, Swin-T+RetinaNet, Swin-T+ATSS, PVT-Small+DETR, TNT-S+DETR, YOLOS-Ti, YOLOS-S, and YOLOS-B.

In one implementation, the disclosed AI system is a convolution neural network (CNN) with a plurality of convolution layers. In another implementation, the disclosed AI system is a recurrent neural network (RNN) such as a long short-term memory network (LSTM), bi-directional LSTM (Bi-LSTM), or a gated recurrent unit (GRU). In yet another implementation, the disclosed AI system includes both a CNN and an RNN.

In yet other implementations, the disclosed AI system can use 1D convolutions, 2D convolutions, 3D convolutions, 4D convolutions, 5D convolutions, dilated or atrous convolutions, transpose convolutions, depthwise separable convolutions, pointwise convolutions, 1×1 convolutions, group convolutions, flattened convolutions, spatial and cross-channel convolutions, shuffled grouped convolutions, spatial separable convolutions, and deconvolutions. The disclosed AI system can use one or more loss functions such as logistic regression/log loss, multi-class cross-entropy/softmax loss, binary cross-entropy loss, mean-squared error loss, L1 loss, L2 loss, smooth L1 loss, and Huber loss. The disclosed AI system can use any parallelism, efficiency, and compression schemes such TFRecords, compressed encoding (e.g., PNG), sharding, parallel calls for map transformation, batching, prefetching, model parallelism, data parallelism, and synchronous/asynchronous stochastic gradient descent (SGD). The disclosed AI system can include upsampling layers, downsampling layers, recurrent connections, gates and gated memory units (like an LSTM or GRU), residual blocks, residual connections, highway connections, skip connections, peephole connections, activation functions (e.g., non-linear transformation functions like rectifying linear unit (ReLU), leaky ReLU, exponential liner unit (ELU), sigmoid and hyperbolic tangent (tanh)), batch normalization layers, regularization layers, dropout, pooling layers (e.g., max or average pooling), global average pooling layers, and attention mechanisms.

The disclosed AI system can be a linear regression model, a logistic regression model, an Elastic Net model, a support vector machine (SVM), a random forest (RF), a decision tree, and a boosted decision tree (e.g., XGBoost), or some other tree-based logic (e.g., metric trees, kd-trees, R-trees, universal B-trees, X-trees, ball trees, locality sensitive hashes, and inverted indexes). The disclosed AI system can be an ensemble of multiple models, in some implementations.

In some implementations, the disclosed AI system can be trained using backpropagation-based gradient update techniques. Example gradient descent techniques that can be used for training the disclosed AI system include stochastic gradient descent, batch gradient descent, and mini-batch gradient descent. Some examples of gradient descent optimization algorithms that can be used to train the disclosed AI system are Momentum, Nesterov accelerated gradient, Adagrad, Adadelta, RMSprop, Adam, AdaMax, Nadam, and AMSGrad.

Transformer Logic

Machine learning is the use and development of computer systems that can learn and adapt without following explicit instructions, by using algorithms and statistical models to analyze and draw inferences from patterns in data. Some of the state-of-the-art models use Transformers, a more powerful and faster model than neural networks alone. Transformers originate from the field of natural language processing (NLP), but can be used in computer vision and many other fields. Neural networks process input in series and weight relationships by distance in the series. Transformers can process input in parallel and do not necessarily weigh by distance. For example, in natural language processing, neural networks process a sentence from beginning to end with the weights of words close to each other being higher than those further apart. This leaves the end of the sentence very disconnected from the beginning causing an effect called the vanishing gradient problem. Transformers look at each word in parallel and determine weights for the relationships to each of the other words in the sentence. These relationships are called hidden states because they are later condensed for use into one vector called the context vector. Transformers can be used in addition to neural networks. This architecture is described here.

Encoder-Decoder Architecture

Figure 6:
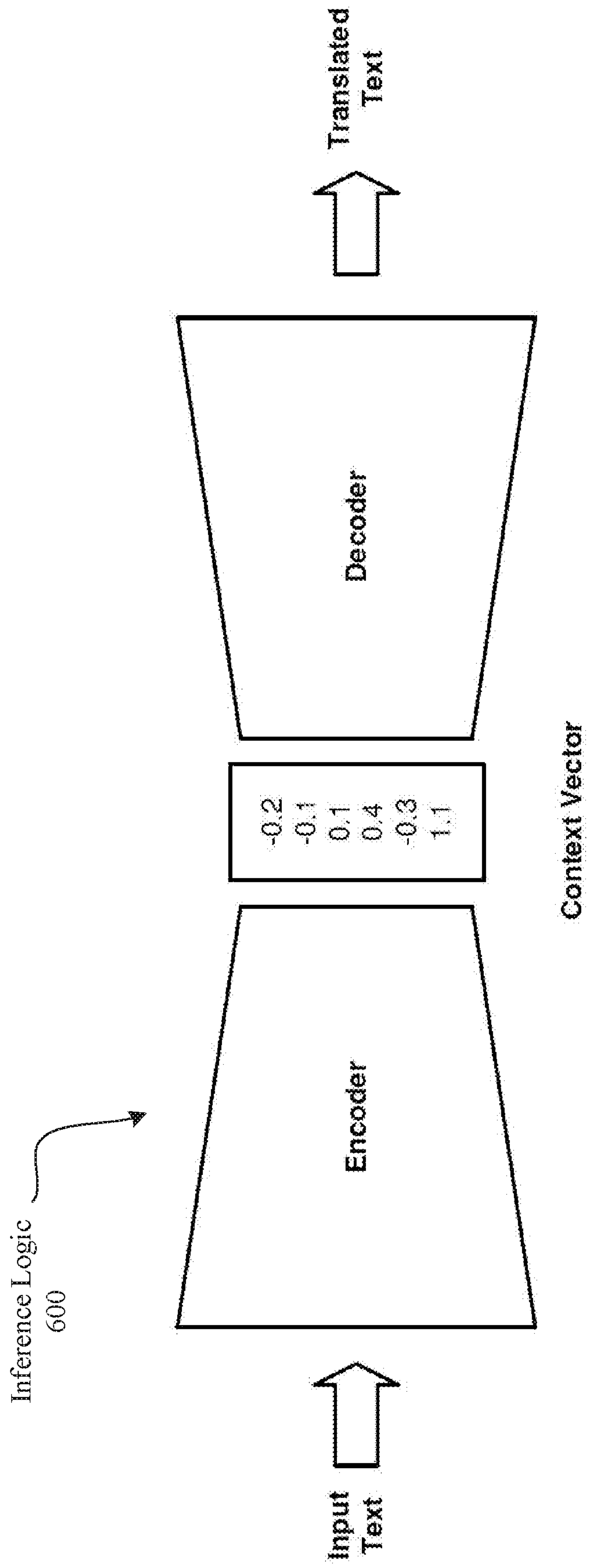
FIG. 6 is a schematic representation of an encoder-decoder architecture, in accordance with an embodiment of the present disclosure.

FIG. 6 is a schematic representation of an encoder-decoder architecture. This architecture is often used for NLP and has two main building blocks. The first building block is the encoder that encodes an input into a fixed-size vector. In the system we describe here, the encoder is based on a recurrent neural network (RNN). At each time step, t, a hidden state of time step, t−1, is combined with the input value at time step t to compute the hidden state at timestep t. The hidden state at the last time step, encoded in a context vector, contains relationships encoded at all previous time steps. For NLP, each step corresponds to a word. Then the context vector contains information about the grammar and the sentence structure. The context vector can be considered a low-dimensional representation of the entire input space. For NLP, the input space is a sentence, and a training set consists of many sentences.

The context vector is then passed to the second building block, the decoder. For translation, the decoder has been trained on a second language. Conditioned on the input context vector, the decoder generates an output sequence. At each time step, t, the decoder is fed the hidden state of time step, t−1, and the output generated at time step, t−1. The first hidden state in the decoder is the context vector, generated by the encoder. The context vector is used by the decoder to perform the translation.

The whole model is optimized end-to-end by using backpropagation, a method of training a neural network in which the initial system output is compared to the desired output and the system is adjusted until the difference is minimized. In backpropagation, the encoder is trained to extract the right information from the input sequence, the decoder is trained to capture the grammar and vocabulary of the output language. This results in a fluent model that uses context and generalizes well. When training an encoder-decoder model, the real output sequence is used to train the model to prevent mistakes from stacking. When testing the model, the previously predicted output value is used to predict the next one.

When performing a translation task using the encoder-decoder architecture, all information about the input sequence is forced into one vector, the context vector. Information connecting the beginning of the sentence with the end is lost, the vanishing gradient problem. Also, different parts of the input sequence are important for different parts of the output sequence, information that cannot be learned using only RNNs in an encoder-decoder architecture.

Attention Mechanism

Figure 7:
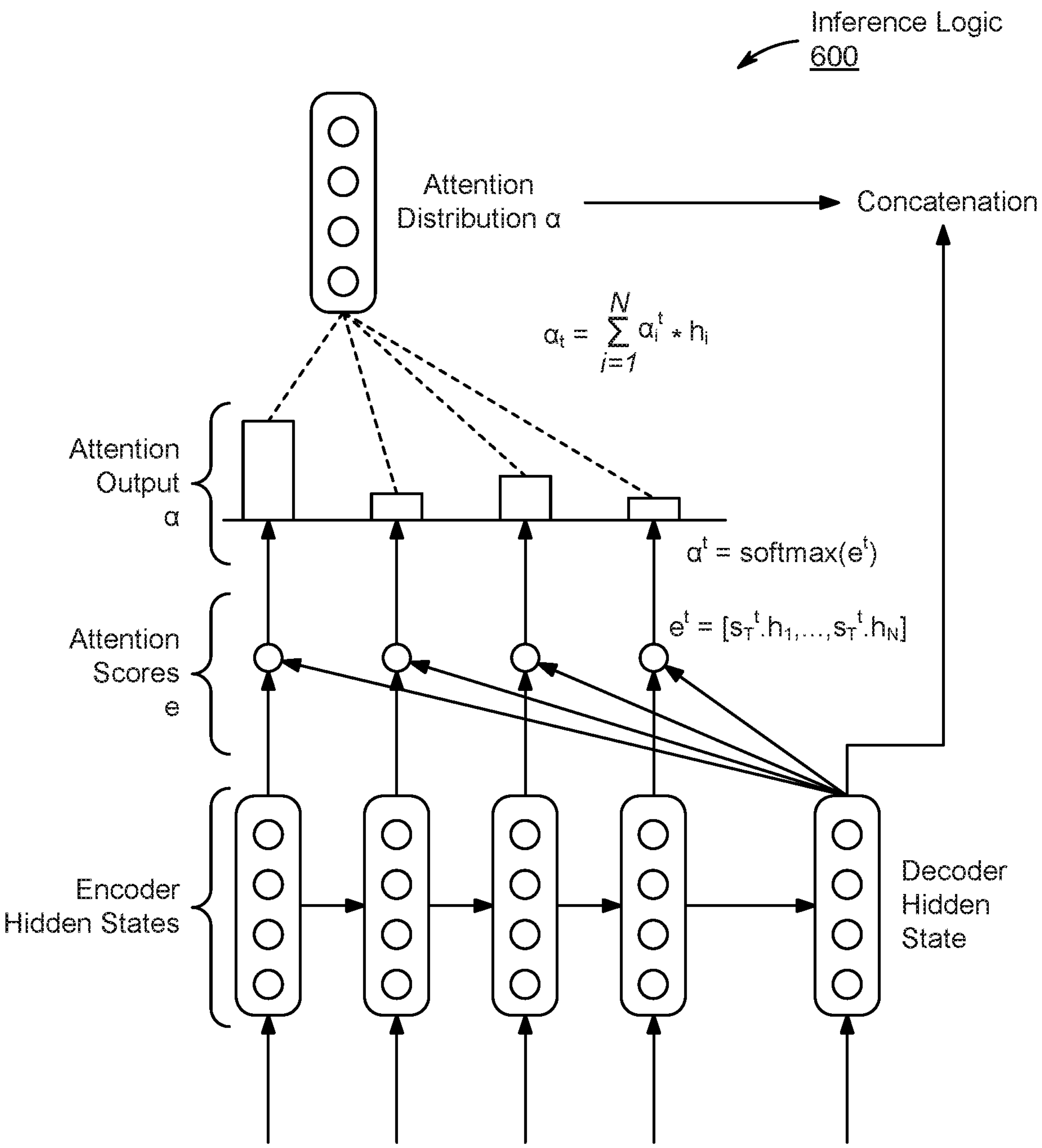
FIG. 7 shows an overview of an attention mechanism added onto an RNN encoder-decoder architecture, in accordance with an embodiment of the present disclosure.

Attention mechanisms distinguish Transformers from other machine learning models. The attention mechanism provides a solution for the vanishing gradient problem. FIG. 7 shows an overview of an attention mechanism added onto an RNN encoder-decoder architecture. At every step, the decoder is given an attention score, e, for each encoder hidden state. In other words, the decoder is given weights for each relationship between words in a sentence. The decoder uses the attention score concatenated with the context vector during decoding. The output of the decoder at time step t is based on all encoder hidden states and the attention outputs. The attention output captures the relevant context for time step t from the original sentence. Thus, words at the end of a sentence may now have a strong relationship with words at the beginning of the sentence. In the sentence "The quick brown fox, upon arriving at the doghouse, jumped over the lazy dog," fox and dog can be closely related despite being far apart in this complex sentence.

To weight encoder hidden states, a dot product between the decoder hidden state of the current time step, and all encoder hidden states, is calculated. This results in an attention score for every encoder hidden state. The attention scores are higher for those encoder hidden states that are similar to the decoder hidden state of the current time step. Higher values for the dot product indicate the vectors are pointing more closely in the same direction. The attention scores are converted to fractions that sum to one using the SoftMax function.

The SoftMax scores provide an attention distribution. The x-axis of the distribution is position in a sentence. The y-axis is attention weight. The scores show which encoder hidden states are most closely related. The SoftMax scores specify which encoder hidden states are the most relevant for the decoder hidden state of the current time step.

The elements of the attention distribution are used as weights to calculate a weighted sum over the different encoder hidden states. The outcome of the weighted sum is called the attention output. The attention output is used to predict the output, often in combination (concatenation) with the decoder hidden states. Thus, both information about the inputs, as well as the already generated outputs, can be used to predict the next outputs.

By making it possible to focus on specific parts of the input in every decoder step, the attention mechanism solves the vanishing gradient problem. By using attention, information flows more directly to the decoder. It does not pass through many hidden states. Interpreting the attention step can give insights into the data. Attention can be thought of as a soft alignment. The words in the input sequence with a high attention score align with the current target word. Attention describes long-range dependencies better than RNN alone. This enables analysis of longer, more complex sentences.

The attention mechanism can be generalized as: given a set of vector values and a vector query, attention is a technique to compute a weighted sum of the vector values, dependent on the vector query. The vector values are the encoder hidden states, and the vector query is the decoder hidden state at the current time step.

The weighted sum can be considered a selective summary of the information present in the vector values. The vector query determines on which of the vector values to focus. Thus, a fixed-size representation of the vector values can be created, in dependence upon the vector query.

The attention scores can be calculated by the dot product, or by weighing the different values (multiplicative attention).

Embeddings

For most machine learning models, the input to the model needs to be numerical. The input to a translation model is a sentence, and words are not numerical. multiple methods exist for the conversion of words into numerical vectors. These numerical vectors are called the embeddings of the words. Embeddings can be used to convert any type of symbolic representation into a numerical one.

Embeddings can be created by using one-hot encoding. The one-hot vector representing the symbols has the same length as the total number of possible different symbols. Each position in the one-hot vector corresponds to a specific symbol. For example, when converting colors to a numerical vector, the length of the one-hot vector would be the total number of different colors present in the dataset. For each input, the location corresponding to the color of that value is one, whereas all the other locations are valued at zero. This works well for working with images. For NLP, this becomes problematic, because the number of words in a language is very large. This results in enormous models and the need for a lot of computational power. Furthermore, no specific information is captured with one-hot encoding. From the numerical representation, it is not clear that orange and red are more similar than orange and green. For this reason, other methods exist.

A second way of creating embeddings is by creating feature vectors. Every symbol has its specific vector representation, based on features. With colors, a vector of three elements could be used, where the elements represent the amount of yellow, red, and/or blue needed to create the color. Thus, all colors can be represented by only using a vector of three elements. Also, similar colors have similar representation vectors.

For NLP, embeddings based on context, as opposed to words, are small and can be trained. The reasoning behind this concept is that words with similar meanings occur in similar contexts. Different methods take the context of words into account. Some methods, like GloVe, base their context embedding on co-occurrence statistics from corpora (large texts) such as Wikipedia. Words with similar co-occurrence statistics have similar word embeddings. Other methods use neural networks to train the embeddings. For example, they train their embeddings to predict the word based on the context (Common Bag of Words), and/or to predict the context based on the word (Skip-Gram). Training these contextual embeddings is time intensive. For this reason, pre-trained libraries exist. Other deep learning methods can be used to create embeddings. For example, the latent space of a variational autoencoder (VAE) can be used as the embedding of the input. Another method is to use 1D convolutions to create embeddings. This causes a sparse, high-dimensional input space to be converted to a denser, low-dimensional feature space.

Self-Attention: Queries (Q), Keys (K), Values (V)

Transformer models are based on the principle of self-attention. Self-attention allows each element of the input sequence to look at all other elements in the input sequence and search for clues that can help it to create a more meaningful encoding. It is a way to look at which other sequence elements are relevant for the current element. The Transformer can grab context from both before and after the currently processed element.

When performing self-attention, three vectors need to be created for each element of the encoder input: the query vector (Q), the key vector (K), and the value vector (V). These vectors are created by performing matrix multiplications between the input embedding vectors using three unique weight matrices.

After this, self-attention scores are calculated. When calculating self-attention scores for a given element, the dot products between the query vector of this element and the key vectors of all other input elements are calculated. To make the model mathematically more stable, these self-attention scores are divided by the root of the size of the vectors. This has the effect of reducing the importance of the scalar thus emphasizing the importance of the direction of the vector. Just as before, these scores are normalized with a SoftMax layer. This attention distribution is then used to calculate a weighted sum of the value vectors, resulting in a vector z for every input element. In the attention principle explained above, the vector to calculate attention scores and to perform the weighted sum was the same, in self-attention two different vectors are created and used. As the self-attention needs to be calculated for all elements (thus a query for every element), one formula can be created to calculate a Z matrix. The rows of this Z matrix are the z vectors for every sequence input element, giving the matrix a size length sequence dimension QKV.

Figure 8:
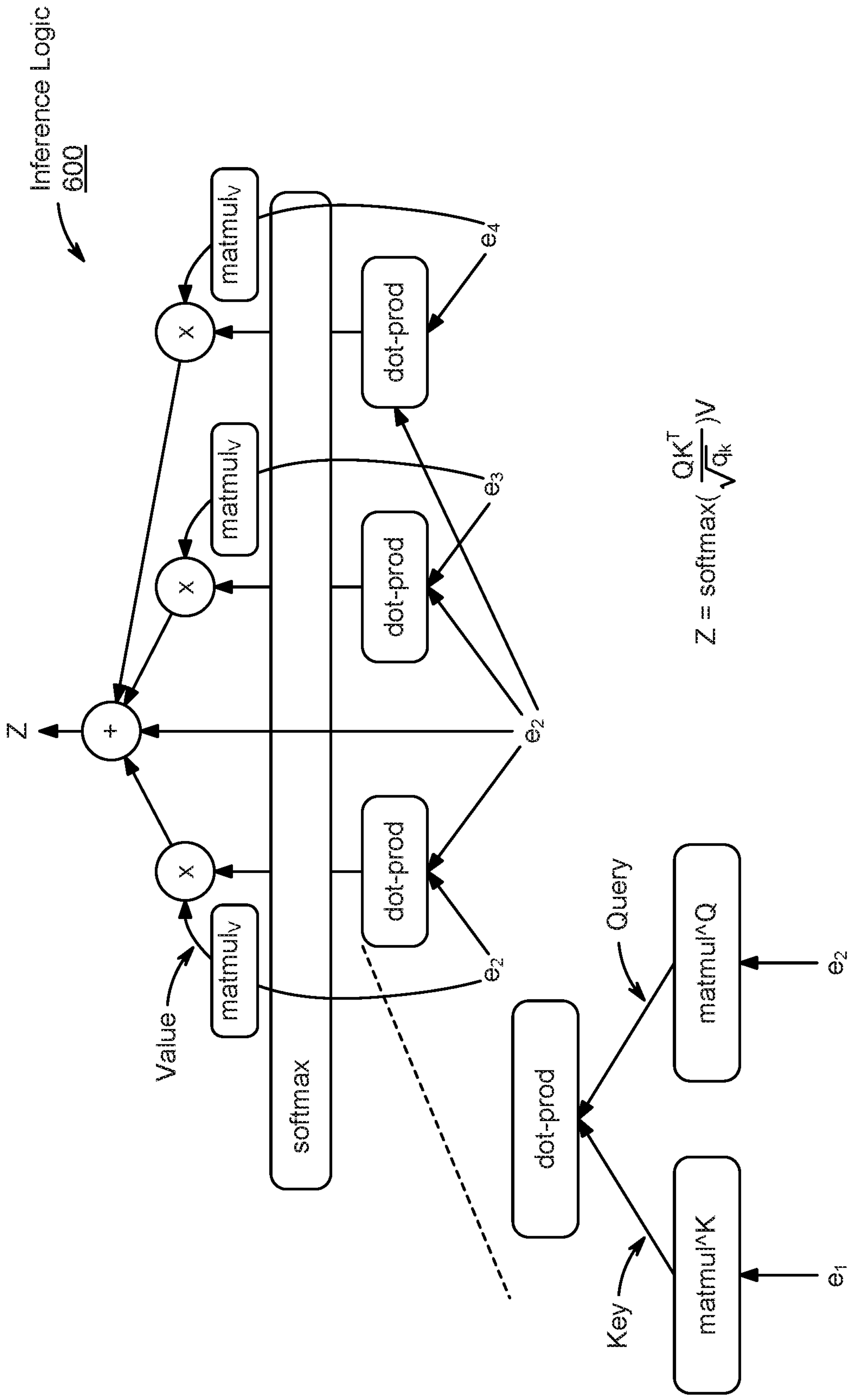
FIG. 8 is a schematic representation of the calculation of self-attention showing one attention head, in accordance with an embodiment of the present disclosure.

Multi-headed attention is executed in the Transformer. FIG. 8 is a schematic representation of the calculation of self-attention showing one attention head. For every attention head, different weight matrices are trained to calculate Q, K, and V. Every attention head outputs a matrix Z. Different attention heads can capture different types of information. The different Z matrices of the different attention heads are concatenated. This matrix can become large when multiple attention heads are used. To reduce dimensionality, an extra weight matrix W is trained to condense the different attention heads into a matrix with the same size as one Z matrix. This way, the amount of data given to the next step does not enlarge every time self-attention is performed.

When performing self-attention, information about the order of the different elements within the sequence is lost. To address this problem, positional encodings are added to the embedding vectors. Every position has its unique positional encoding vector. These vectors follow a specific pattern, which the Transformer model can learn to recognize. This way, the model can consider distances between the different elements.

As discussed above, in the core of self-attention are three objects: queries (Q), keys (K), and values (V). Each of these objects has an inner semantic meaning of their purpose. One can think of these as analogous to databases. We have a user-defined query of what the user wants to know. Then we have the relations in the database, i.e., the values which are the weights. More advanced database management systems create some apt representation of its relations to retrieve values more efficiently from the relations. This can be achieved by using indexes, which represent information about what is stored in the database. In the context of attention, indexes can be thought of as keys. So instead of running the query against values directly, the query is first executed on the indexes to retrieve where the relevant values or weights are stored. Lastly, these weights are run against the original values to retrieve data that is most relevant to the initial query.

Figure 9:
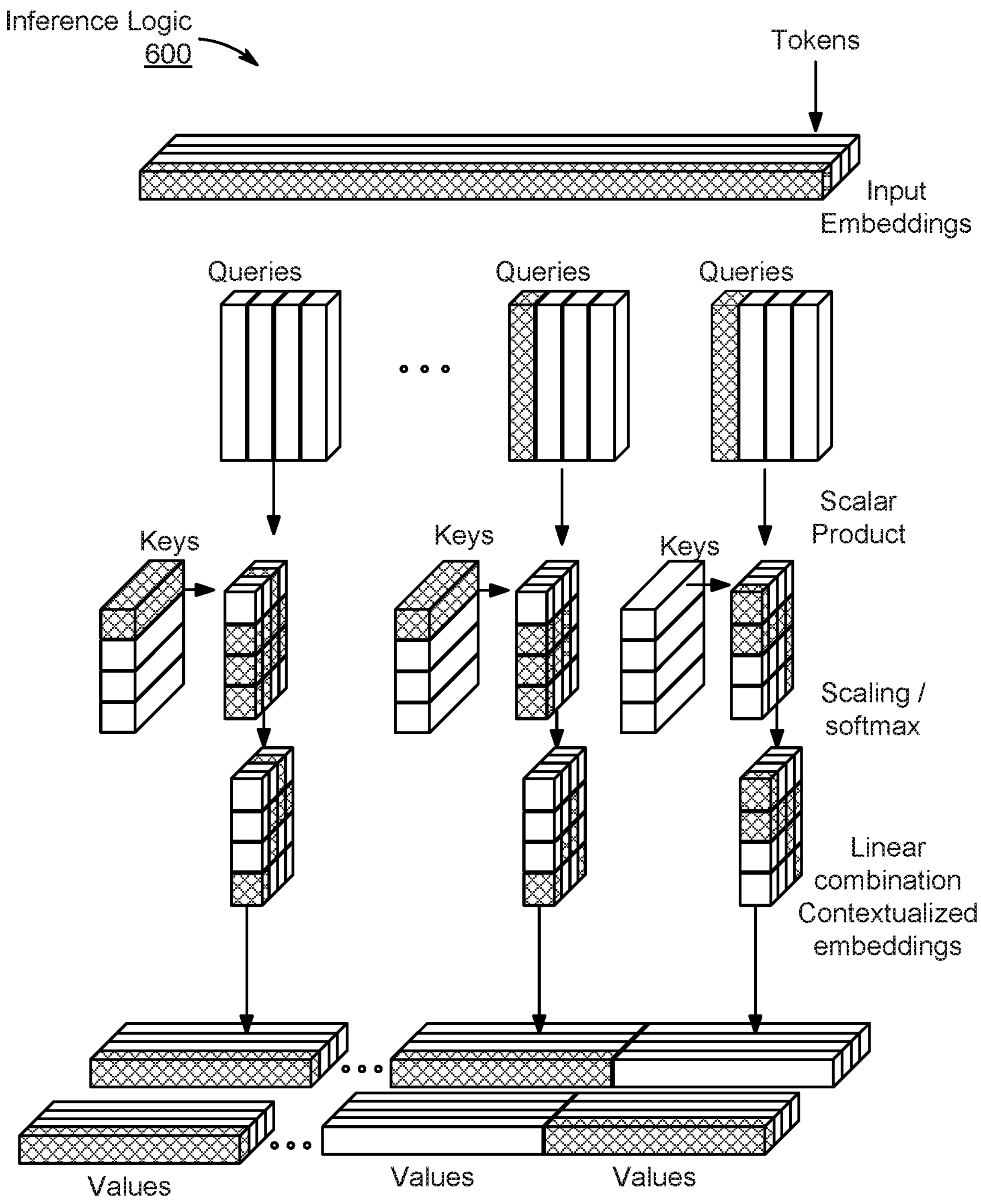
FIG. 9 is a depiction of several attention heads in a Transformer block, in accordance with an embodiment of the present disclosure.

FIG. 9 depicts several attention heads in a Transformer block. We can see that the outputs of queries and keys dot products in different attention heads are differently colored. This depicts the capability of the multi-head attention to focus on different aspects of the input and aggregate the obtained information by multiplying the input with different attention weights.

Examples of attention calculation include scaled dot-product attention and additive attention. There are several reasons why scaled dot-product attention is used in the Transformers. Firstly, the scaled dot-product attention is relatively fast to compute, since its main parts are matrix operations that can be run on modern hardware accelerators. Secondly, it performs similarly well for smaller dimensions of the K matrix, dk, as the additive attention. For larger dk, the scaled dot-product attention performs a bit worse because dot products can cause the vanishing gradient problem. This is compensated via the scaling factor, which is defined as dk.

As discussed above, the attention function takes as input three objects: key, value, and query. In the context of Transformers, these objects are matrices of shapes (n, d), where n is the number of elements in the input sequence and d is the hidden representation of each element (also called the hidden vector). Attention is then computed as:

$$\text{Attention}(Q,K,V)=\text{SoftMax}((QK^T)/\sqrt{dk})V$$

where Q, K, V are computed as:

$$X\cdot W\_Q, X\cdot W\_K, X\cdot W\_V$$

X is the input matrix and WQ, WK, WV are learned weights to project the input matrix into the representations. The dot products appearing in the attention function are exploited for their geometrical interpretation where higher values of their results mean that the inputs are more similar, i.e., pointing in the geometrical space in the same direction. Since the attention function now works with matrices, the dot product becomes matrix multiplication. The SoftMax function is used to normalize the attention weights into the value of 1 prior to being multiplied by the values matrix. The resulting matrix is used either as input into another layer of attention or becomes the output of the Transformer.

Multi-Head Attention

Transformers become even more powerful when multi-head attention is used. Queries, keys, and values are computed the same way as above, though they are now projected into h different representations of smaller dimensions using a set of h learned weights. Each representation is passed into a different scaled dot-product attention block called a head. The head then computes its output using the same procedure as described above.

Formally, the multi-head attention is defined as:

$$\text{MultiHeadAttention}(Q,K,V)=[\text{head1}, \ldots, \text{headh}]W0$$
$$\text{where headi}=\text{Attention}(QW\_iQ, KW\_iK, VW\_iV)$$

The outputs of all heads are concatenated together and projected again using the learned weights matrix W0 to match the dimensions expected by the next block of heads or the output of the Transformer. Using the multi-head attention instead of the simpler scaled dot-product attention enables Transformers to jointly attend to information from different representation subspaces at different positions.

Figure 10:
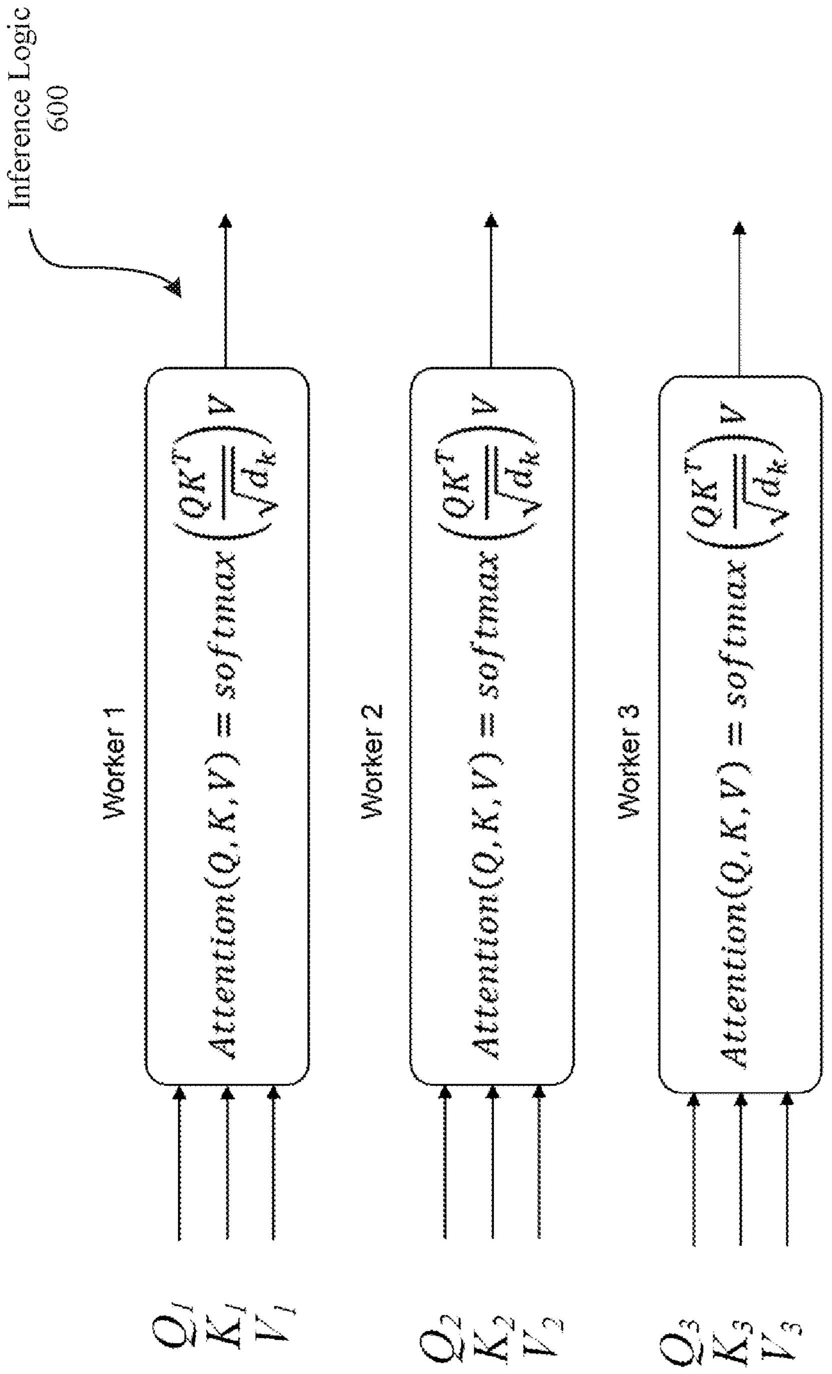
FIG. 10 is an illustration that shows how one can use multiple workers to compute the multi-head attention in parallel, as the respective heads compute their outputs independently of one another, in accordance with an embodiment of the present disclosure.

As shown in FIG. 10, one can use multiple workers to compute the multi-head attention in parallel, as the respective heads compute their outputs independently of one another. Parallel processing is one of the advantages of Transformers over RNNs.

Assuming the naive matrix multiplication algorithm which has a complexity of:

$$a\cdot b\cdot c$$

For matrices of shape (a, b) and (c, d), to obtain values Q, K, V, we need to compute the operations:

$$X\cdot WQ, X\cdot WK, X\cdot WV$$

The matrix X is of shape (n, d) where n is the number of patches and d is the hidden vector dimension. The weights WQ, WK, WV are all of shape (d, d). Omitting the constant factor 3, the resulting complexity is:

$$n\cdot d2$$

We can proceed to the estimation of the complexity of the attention function itself, i.e., of SoftMax $$\left(\frac{QK^T}{\sqrt{dk}}\right)V.$$

The matrices Q and K are both of shape (n, d). The transposition operation does not influence the asymptotic complexity of computing the dot product of matrices of shapes (n, d)·(d, n), therefore its complexity is:

$$n2 \cdot d$$

Scaling by a constant factor of $\sqrt{dk}$, where dk is the dimension of the keys vector, as well as applying the SoftMax function, both have the complexity of a·b for a matrix of shape (a, b), hence they do not influence the asymptotic complexity. Lastly the dot product SoftMax $$\left(\frac{QK^T}{\sqrt{dk}}\right).$$

V is between matrices of shapes (n, n) and (n, d) and so its complexity is:

$$n2 \cdot d$$

The final asymptotic complexity of scaled dot-product attention is obtained by summing the complexities of computing Q, K, V, and of the following attention function:

$$n \cdot d2 + n2 \cdot d.$$

The asymptotic complexity of multi-head attention is the same since the original input matrix X is projected into h matrices of shapes (n, d/h), where h is the number of heads. From the point of view of asymptotic complexity, h is constant, therefore we would arrive at the same estimate of asymptotic complexity using a similar approach as for the scaled dot-product attention.

Transformer models often have the encoder-decoder architecture, although this is not necessarily the case. The encoder is built out of different encoder layers which are all constructed in the same way. The positional encodings are added to the embedding vectors. Afterward, self-attention is performed.

Encoder Block of Transformer

Figure 11:
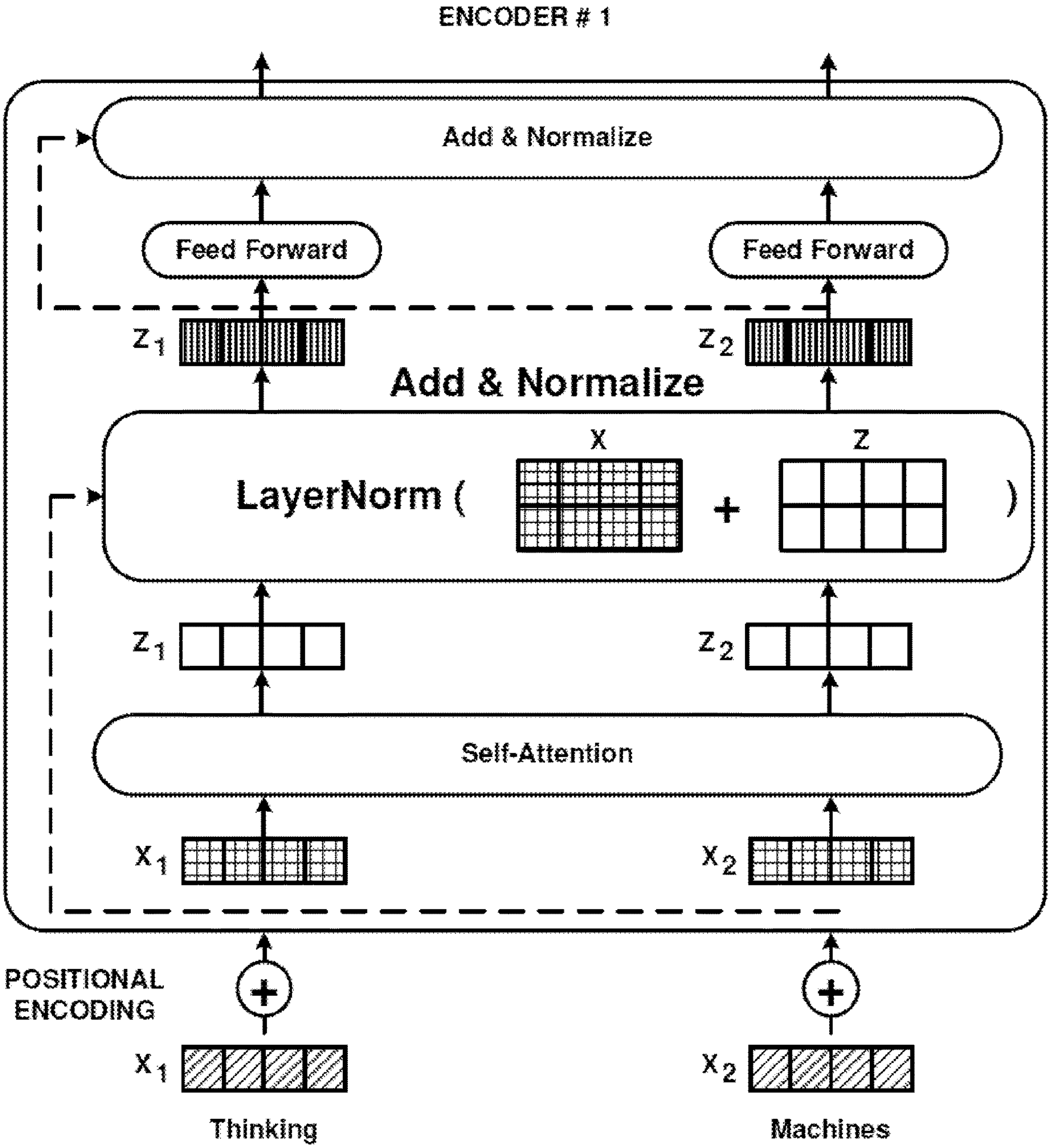
FIG. 11 is a portrayal of one encoder layer of a Transformer network, in accordance with an embodiment of the present disclosure.

FIG. 11 portrays one encoder layer of a Transformer network. Every self-attention layer is surrounded by a residual connection, summing up the output and input of the self-attention. This sum is normalized, and the normalized vectors are fed to a feed-forward layer. Every z vector is fed separately to this feed-forward layer. The feed-forward layer is wrapped in a residual connection and the outcome is normalized too. Often, numerous encoder layers are piled to form the encoder. The output of the encoder is a fixed-size vector for every element of the input sequence.

Just like the encoder, the decoder is built from different decoder layers. In the decoder, a modified version of self-attention takes place. The query vector is only compared to the keys of previous output sequence elements. The elements further in the sequence are not known yet, as they still must be predicted. No information about these output elements may be used.

Encoder-Decoder Blocks of Transformer

Figure 12:
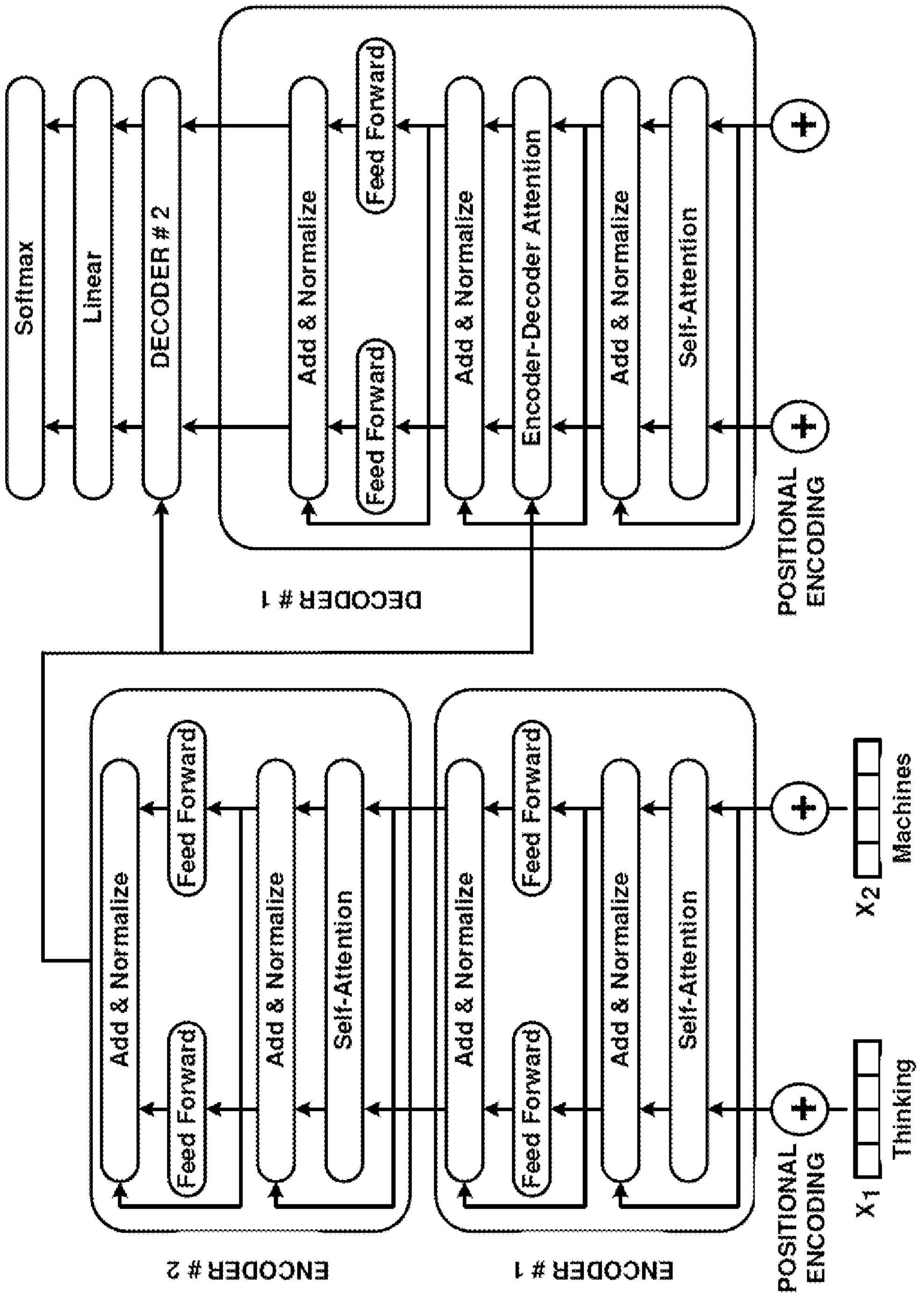
FIG. 12 shows a schematic overview of a Transformer model, in accordance with an embodiment of the present disclosure.
Figure 13B:
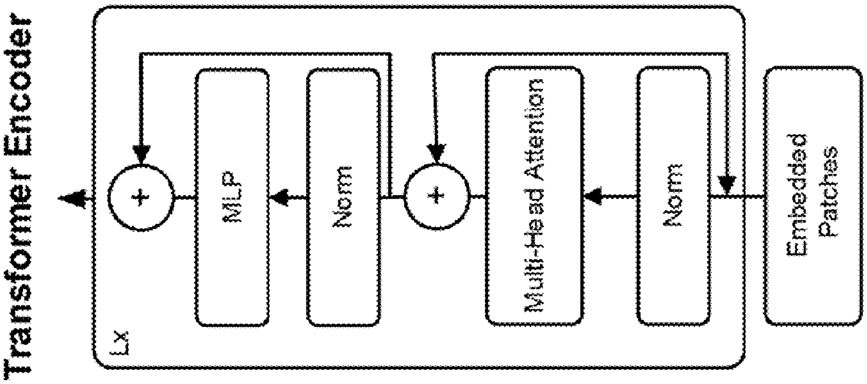
FIGS. 13A and 13B is a depiction of a Vision Transformer (ViT), in accordance with an embodiment of the present disclosure.
Figure 13A:
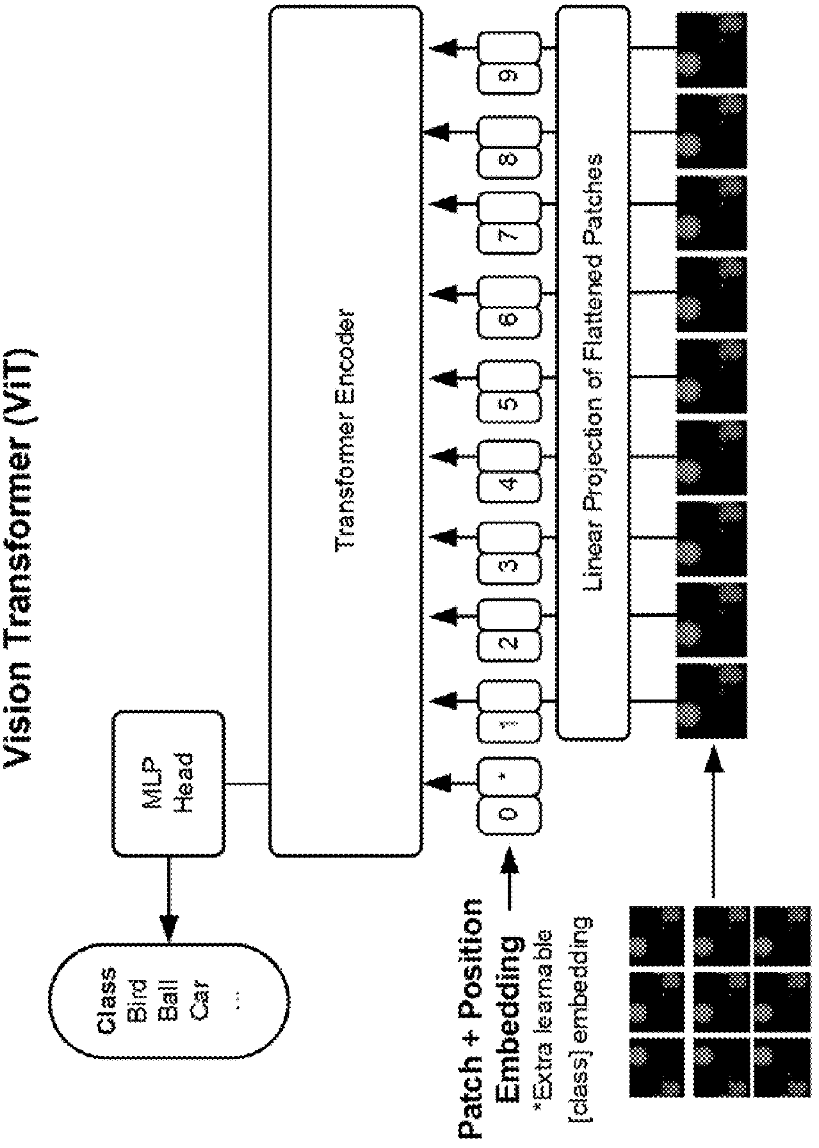
Figures 14A, 14B, 14C, 14D:
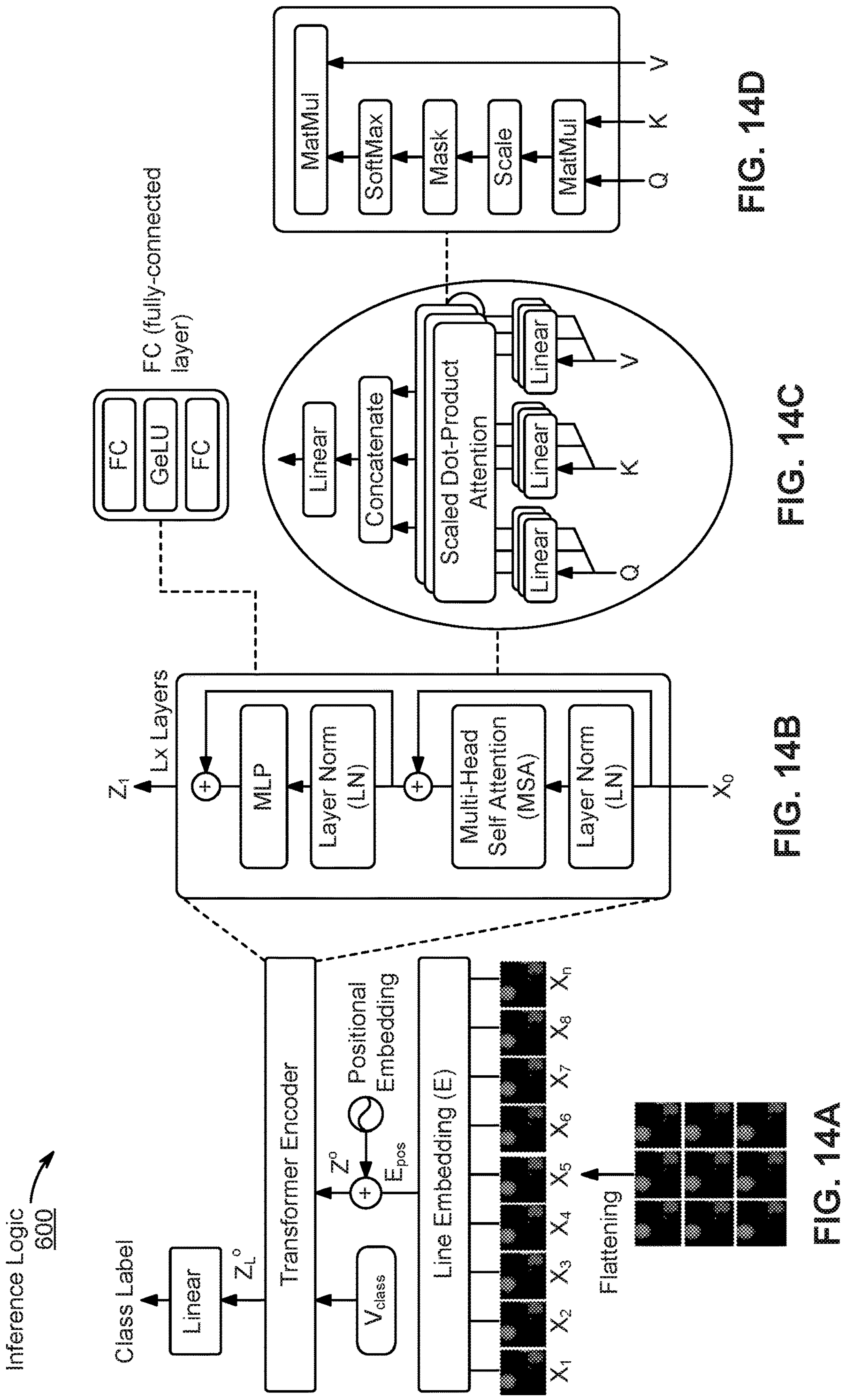
FIG. 14A-D illustrates a processing flow of the Vision Transformer (ViT), in accordance with an embodiment of the present disclosure.

FIG. 12 shows a schematic overview of a Transformer model. Next to a self-attention layer, a layer of encoder-decoder attention is present in the decoder, in which the decoder can examine the last Z vectors of the encoder, providing fluent information transmission. The ultimate decoder layer is a feed-forward layer. All layers are packed in a residual connection. This allows the decoder to examine all previously predicted outputs and all encoded input vectors to predict the next output. Thus, information from the encoder is provided to the decoder, which could improve the predictive capacity. The output vectors of the last decoder layer need to be processed to form the output of the entire system. This is done by a combination of a feed-forward layer and a SoftMax function. The output corresponding to the highest probability is the predicted output value for a subject time step.

For some tasks other than translation, only an encoder is needed. This is true for both document classification and name entity recognition. In these cases, the encoded input vectors are the input of the feed-forward layer and the SoftMax layer. Transformer models have been extensively applied in different NLP fields, such as translation, document summarization, speech recognition, and named entity recognition. These models have applications in the field of biology as well for predicting protein structure and function and labeling DNA sequences.

Vision Transformer

There are extensive applications of transformers in vision including popular recognition tasks (e.g., image classification, object detection, action recognition, and segmentation), generative modeling, multi-modal tasks (e.g., visual-question answering, visual reasoning, and visual grounding), video processing (e.g., activity recognition, video forecasting), low-level vision (e.g., image super-resolution, image enhancement, and colorization) and 3D analysis (e.g., point cloud classification and segmentation).

Transformers were originally developed for NLP and worked with sequences of words. In image classification, we often have a single input image in which the pixels are in a sequence. To reduce the computation required, Vision Transformers (ViTs) cut the input image into a set of fixed-sized patches of pixels. The patches are often 16×16 pixels. They are treated much like words in NLP Transformers. ViTs are depicted in FIGS. 13A, 13B, 14A, 14B, 14C, and 14D. Unfortunately, important positional information is lost because image sets are position-invariant. This problem is solved by adding a learned positional encoding into the image patches.

The computations of the ViT architecture can be summarized as follows. The first layer of a ViT extracts a fixed number of patches from an input image (13A). The patches are then projected to linear embeddings. A special class token vector is added to the sequence of embedding vectors to include all representative information of all tokens through the multi-layer encoding procedure. The class vector is unique to each image. Vectors containing positional information are combined with the embeddings and the class token. The sequence of embedding vectors is passed into the Transformer blocks. The class token vector is extracted from the output of the last Transformer block and is passed into a multilayer perceptron (MLP) head whose output is the final classification. The perceptron takes the normalized input and places the output in categories. It classifies the images. This procedure directly translates into the Python Keras code shown in FIG. 15.

When the input image is split into patches, a fixed patch size is specified before instantiating a ViT. Given the quadratic complexity of attention, patch size has a large effect on the length of training and inference time. A single Transformer block comprises several layers. The first layer implements Layer Normalization, followed by the multi-head attention that is responsible for the performance of ViTs. In the depiction of a Transformer block in FIG. 13B, we can see two arrows. These are residual skip connections. Including skip connection data can simplify the output and improve the results. The output of the multi-head attention is followed again by Layer Normalization. And finally, the output layer is an MLP (Multi-Layer Perceptron) with the GELU (Gaussian Error Linear Unit) activation function.

ViTs can be pretrained and fine-tuned. Pretraining is generally done on a large dataset. Fine-tuning is done on a domain specific dataset.

Domain-specific architectures, like convolutional neural networks (CNNs) or long short-term memory networks (LSTMs), have been derived from the usual architecture of MLPs and suffer from so-called inductive biases that predispose the networks towards a certain output. ViTs stepped in the opposite direction of CNNs and LSTMs and became more general architectures by eliminating inductive biases. A ViT can be seen as a generalization of MLPs because MLPs, after being trained, do not change their weights for different inputs. On the other hand, ViTs compute their attention weights at runtime based on the particular input.

The following detailed description is made with reference to the figures. Example implementations are described to illustrate the technology disclosed, not to limit its scope, which is defined by the claims. Those of ordinary skill in the art will recognize a variety of equivalent variations on the description that follows. Reference will now be made in detail to the exemplary implementations of the present disclosure, examples of which are illustrated in the accompanying drawings. Wherever possible, the same reference numbers will be used throughout the drawings to refer to the same or like parts.

The following discussion is presented to enable any person skilled in the art to make and use the technology disclosed and is provided in the context of a particular application and its requirements. Various modifications to the disclosed implementations will be readily apparent to those skilled in the art, and the general principles defined herein may be applied to other implementations and applications without departing from the spirit and scope of the technology disclosed. Thus, the technology disclosed is not intended to be limited to the implementations shown but is to be accorded the widest scope consistent with the principles and features disclosed herein.

The systems, devices, and methods disclosed herein are described in detail by way of examples and with reference to the figures. The examples discussed herein are examples only and are provided to assist in the explanation of the apparatuses, devices, systems, and methods described herein. None of the features or components shown in the drawings or discussed below should be taken as mandatory for any specific implementation of any of these devices, systems, or methods unless specifically designated as mandatory.

Also, for any methods described, regardless of whether the method is described in conjunction with a flow diagram, it should be understood that unless otherwise specified or required by context, any explicit or implicit ordering of steps performed in the execution of a method does not imply that those steps must be performed in the order presented but instead may be performed in a different order or in parallel.

The detailed description of various implementations will be better understood when read in conjunction with the appended drawings. To the extent that the figures illustrate diagrams of the functional blocks of the various implementations, the functional blocks are not necessarily indicative of the division between hardware circuitry. Thus, for example, one or more of the functional blocks (e.g., modules, processors, or memories) may be implemented in a single piece of hardware (e.g., a general-purpose signal processor or a block of random-access memory, hard disk, or the like) or multiple pieces of hardware. Similarly, the programs may be stand-alone programs, may be incorporated as subroutines in an operating system, may be functions in an installed software package, and the like. It should be understood that the various implementations are not limited to the arrangements and instrumentality shown in the drawings.

The processing engines and databases of the figures, designated as modules, can be implemented in hardware or software, and need not be divided up in precisely the same blocks as shown in the figures. Some of the modules can also be implemented on different processors, computers, or servers, or spread among a number of different processors, computers, or servers. In addition, it will be appreciated that some of the modules can be combined, operated in parallel or in a different sequence than that shown in the figures without affecting the functions achieved. The modules in the figures can also be thought of as flowchart steps in a method. A module also need not necessarily have all its code disposed contiguously in memory; some parts of the code can be separated from other parts of the code with code from other modules or other functions disposed in between.

CLAUSES

The technology disclosed can be practiced as a system, method, or article of manufacture. One or more features of an implementation can be combined with the base implementation. Implementations that are not mutually exclusive are taught to be combinable. One or more features of an implementation can be combined with other implementations. This disclosure periodically reminds the user of these options. Omission from some implementations of recitations that repeat these options should not be taken as limiting the combinations taught in the preceding sections, these recitations are hereby incorporated forward by reference into each of the following implementations.

One or more implementations and clauses of the technology disclosed, or elements thereof can be implemented in the form of a computer product, including a non-transitory computer readable storage medium with computer usable program code for performing the method steps indicated. Furthermore, one or more implementations and clauses of the technology disclosed, or elements thereof can be implemented in the form of an apparatus including a memory and at least one processor that is coupled to the memory and operative to perform exemplary method steps. Yet further, in another aspect, one or more implementations and clauses of the technology disclosed or elements thereof can be implemented in the form of means for carrying out one or more of the method steps described herein; the means can include (i) hardware module(s), (ii) software module(s) executing on one or more hardware processors, or (iii) a combination of hardware and software modules; any of (i)-(iii) implement the specific techniques set forth herein, and the software modules are stored in a computer readable storage medium (or multiple such media).

The clauses described in this section can be combined as features. In the interest of conciseness, the combinations of features are not individually enumerated and are not repeated with each base set of features. The reader will understand how features identified in the clauses described in this section can readily be combined with sets of base features identified as implementations in other sections of this application. These clauses are not meant to be mutually exclusive, exhaustive, or restrictive; and the technology disclosed is not limited to these clauses but rather encompasses all possible combinations, modifications, and variations within the scope of the claimed technology and its equivalents.

Other implementations of the clauses described in this section can include a non-transitory computer readable storage medium storing instructions executable by a processor to perform any of the clauses described in this section. Yet another implementation of the clauses described in this section can include a system including memory and one or more processors operable to execute instructions, stored in the memory, to perform any of the clauses described in this section.

The above-described hardware description is a non-limiting example of corresponding structure for performing the functionality described herein.

Numerous modifications and variations of the present disclosure are possible in light of the above teachings. It is therefore to be understood that the invention may be practiced otherwise than as specifically described herein.

What is claimed is:

1. A computer-implemented method, comprising:

binding a simulation agent to at least one tool-access interface of an agentic AI system to replace at least one external tool;

intercepting, by the simulation agent, a request emitted at the at least one tool-access interface;

generating, by the simulation agent, a protocol-compliant response using synthetic data and a simulated environment;

substituting, by the simulation agent, the protocol-compliant response for an expected response from the at least one external tool, thereby enabling the agentic AI system to execute tasks without invoking the at least one external tool;

executing, by the agentic AI system, at least one execution run of a predefined task suite under simulated conditions, wherein actual agent outputs produced during the at least one execution run are evaluated against expected outputs defined for the predefined task suite; and generating, by the simulation agent, a performance vector.

2. The method of claim 1, further comprising maintaining, by the simulation agent, a simulation registry comprising metadata of simulated tools, schema definitions, configuration parameters, and execution logs, and wherein the simulation agent dynamically updates the simulation registry based on prior simulation outcomes.

3. The method of claim 1, wherein the simulation agent generates synthetic data in one or more machine-readable formats, enabling agents of the agentic AI system to perform tasks including data retrieval, analysis, decision-making, and benchmarking in the simulated environment.

4. The method of claim 1, wherein the simulated environment instantiates a plurality of agent roles each having defined task responsibilities, tool-access permissions, and inter-agent collaboration relationships, wherein the agent roles and tool-access permissions replicate a distributed workflow of the agentic AI system under test.

5. The method of claim 1, wherein evaluating the actual agent outputs against the expected outputs comprises:

computing, by a benchmarking evaluator, task success percentages and latency differentials between execution runs; and correlating, by an AI-based evaluator, semantic correctness between the actual agent outputs and the expected outputs.

6. The method of claim 1, further comprising selecting, by the simulation agent, among a plurality of language model configurations for one or more agents of the agentic AI system based on reward scores derived from task accuracy, efficiency, or runtime performance, and storing a selected model configuration profile in a simulation registry for use in subsequent execution runs.

7. The method of claim 1, wherein the simulation agent is configured to operate in a stealth observation mode, the method comprising:

injecting, by the simulation agent, into a live agentic AI environment comprising a plurality of operational agents and bound tools;

intercepting, by the simulation agent, communications among the operational agents and the bound tools to capture invocation traces, context tokens, and response payloads;

storing, by the simulation agent, the invocation traces within a secured simulation dataset;

training, by the simulation agent using the secured simulation dataset, one or more surrogate models emulating behavior of the bound tools; and replacing, by the simulation agent in subsequent simulation runs, tool dependencies with the one or more surrogate models to enable nosed-loop autonomous simulation.

8. The method of claim 7, wherein the stealth observation mode operates with non-intrusive instrumentation configured to avoid modification of a state of the operational agents in the live agentic AI environment.

9. The method of claim 1, wherein the at least one execution run comprises executing a healthy run and a fault-injected run of the predefined task suite.

10. The method of claim 1, further comprising adjusting, by the simulation agent, computational resource allocation and execution path selection among a plurality of simulation agents using reinforcement-learning policies based on reward signals derived from the evaluation of the actual agent outputs against the expected outputs.

11. The method of claim 1, wherein the simulation agent enables privacy-compliant testing by generating synthetic data, collecting structured and unstructured data from a plurality of data sources, and synthesizing the structured and unstructured data into realistic testing scenarios reflecting real-world and industry-specific conditions.

12. The method of claim 1, further comprising generating, by the simulation agent, an autonomous feedback pipeline that continuously incorporates updated evaluation results, synthetic data augmentations, and tool emulation parameters to maintain convergence between the simulated environment and a live agentic AI environment.

13. The method of claim 1, wherein the simulation agent exports simulation artifacts, including synthetic datasets, trained surrogate tool models, model configuration profiles, and evaluation summaries, to a simulation dataset for reuse in subsequent training or verification of agentic AI systems.

14. A system, comprising:

at least one processor; and a memory storing computer-executable instructions that, when executed by the at least one processor, cause the system to:

bind a simulation agent to at least one tool-access interface of an agentic AI system configured to replace at least one external tool;

intercept a request emitted at the at least one tool-access interface;

generate a protocol-compliant response using synthetic data and a simulated environment;

substitute the protocol-compliant response for an expected response from the at least one external tool, thereby enabling the agentic AI system to execute tasks without invoking the at least one external tool;

execute at least one execution run of a predefined task suite under simulated conditions, wherein actual agent outputs produced during the at least one execution run are evaluated against expected outputs defined for the predefined task suite; and generate a performance vector.

15. The system of claim 14, wherein the at least one tool-access interface comprises one or more of file-system calls, retrieval-augmented search connectors, database drivers, or HTTP endpoints, and the synthetic data comprise structured or unstructured data organized within a synthetic directory hierarchy.

16. The system of claim 14, wherein the simulated environment instantiates a plurality of agent roles each having defined task responsibilities, tool-access permissions, and inter-agent collaboration relationships that replicate a distributed workflow of the agentic AI system, and wherein the simulation agent constructs simulated repositories, virtual APIs, and database instances reflecting operational parameters of the at least one external tool.

17. The system of claim 14, wherein the simulation agent injects one or more faults selected from file corruption, data truncation, record omission, network delay, protocol error, or erroneous human-input signaling according to a predefined fault schedule that specifies temporal offsets, repetition intervals, and severity levels.

18. The system of claim 14, wherein the simulation agent selects among a plurality of language model configurations for one or more agents of the agentic AI system based on reward scores derived from task accuracy, efficiency, or runtime performance, and stores selected model configuration profiles in a simulation registry for reuse in subsequent execution runs.

19. The system of claim 14, wherein the simulation agent exports simulation artifacts, including synthetic datasets, trained surrogate tool models, and evaluation summaries, to a simulation dataset for reuse in subsequent training or verification of agentic AI systems.

20. A non-transitory computer-readable storage medium storing instructions which, when executed by at least one processor, cause the at least one processor to perform operations comprising:

binding a simulation agent to at least one tool-access interface of an agentic AI system to replace at least one external tool;

intercepting, by the simulation agent, a request emitted at the at least one tool-access interface;

generating, by the simulation agent, a protocol-compliant response using synthetic data and a simulated environment;

substituting, by the simulation agent, the protocol-compliant response for an expected response from the at least one external tool, thereby enabling the agentic AI system to execute tasks without invoking the at least one external tool;

executing, by the agentic AI system, at least one execution run of a predefined task suite under simulated conditions, wherein actual agent outputs produced during the at least one execution run are evaluated against expected outputs defined for the predefined task suite; and generating, by the simulation agent, a performance vector.

* * * * *